US010768677B2

(12) United States Patent
Lin et al.

(10) Patent No.: US 10,768,677 B2
(45) Date of Patent: Sep. 8, 2020

(54) HEAT DISSIPATING DEVICE HAVING COLORED LIGHTING AND PERSISTENCE EFFECT

(71) Applicant: COOLER MASTER TECHNOLOGY INC., New Taipei (TW)

(72) Inventors: Roger Lin, New Taipei (TW); Tzyy-Ing Wang, New Taipei (TW)

(73) Assignee: COOLER MASTER TECHNOLOGY INC., New Taipei (TW)

( * ) Notice: Subject to any disclaimer, the term of this patent is extended or adjusted under 35 U.S.C. 154(b) by 112 days.

(21) Appl. No.: 15/952,545

(22) Filed: Apr. 13, 2018

(65) Prior Publication Data
US 2019/0317577 A1    Oct. 17, 2019

(51) Int. Cl.
| | |
|---|---|
| G06F 1/20 | (2006.01) |
| F21V 8/00 | (2006.01) |
| H05K 7/20 | (2006.01) |
| F04D 29/00 | (2006.01) |
| F21V 23/00 | (2015.01) |
| F21V 33/00 | (2006.01) |

(52) U.S. Cl.
CPC ............ *G06F 1/206* (2013.01); *F04D 29/005* (2013.01); *F21V 23/003* (2013.01); *F21V 33/0092* (2013.01); *G02B 6/0068* (2013.01); *G02B 6/0075* (2013.01); *G02B 6/0086* (2013.01); *H05K 7/20172* (2013.01); *H05K 7/20209* (2013.01); *H05K 7/20263* (2013.01); *H05K 7/20272* (2013.01); *H05K 7/20281* (2013.01); *G06F 1/20* (2013.01); *G06F 2200/201* (2013.01)

(58) Field of Classification Search
CPC ....... G06F 1/206; G06F 1/20; H05K 7/20272; H05K 7/20281; F21V 29/56; F21V 29/57; F21V 29/59; F21V 29/65; F21V 29/673; H01L 33/648
See application file for complete search history.

(56) References Cited

U.S. PATENT DOCUMENTS

| | | | | |
|---|---|---|---|---|
| 8,051,898 | B2 * | 11/2011 | Chiang | H01L 23/473 |
| | | | | 165/104.28 |
| 8,746,326 | B2 * | 6/2014 | Mou | H01L 23/473 |
| | | | | 165/104.33 |
| 9,115,882 | B2 * | 8/2015 | DeRose | F21V 29/30 |
| 9,797,590 | B2 * | 10/2017 | Zhang | F21V 23/06 |
| 10,054,289 | B2 * | 8/2018 | Wen | F21V 17/101 |
| 10,455,732 | B2 * | 10/2019 | Pan | H01L 23/473 |
| 2006/0002104 | A1 * | 1/2006 | Willis | F21V 23/005 |
| | | | | 362/101 |
| 2011/0133623 | A1 * | 6/2011 | Tsai | F21V 29/30 |
| | | | | 313/46 |

(Continued)

*Primary Examiner* — Nelson J Nieves
(74) *Attorney, Agent, or Firm* — McDermott Will & Emery LLP

(57) ABSTRACT

A heat dissipating device includes a bottom assembly, a first light guide positioned on the bottom assembly, a first light assembly positioned on the first light guide, and an outer cover positioned on the bottom assembly and at least partially enclosing the bottom assembly, the first light guide, and the first light assembly. The outer cover defines a first opening on a top surface thereof, at least a portion of the first light guide is received in the first opening, and light from the first light assembly is emitted from the heat dissipating device through the exposed portion of the first light guide.

42 Claims, 33 Drawing Sheets

(56) References Cited

U.S. PATENT DOCUMENTS

| | | | |
|---|---|---|---|
| 2012/0044642 A1* | 2/2012 | Rodriguez | H05B 33/0803 361/692 |
| 2012/0063116 A1* | 3/2012 | Baxter | F21V 29/673 362/6 |
| 2013/0003392 A1* | 1/2013 | Tsai | F21V 29/20 362/373 |
| 2013/0058100 A1* | 3/2013 | DeRose | F21V 29/30 362/294 |
| 2013/0301259 A1* | 11/2013 | Ahn | F21V 29/02 362/235 |
| 2014/0177238 A1* | 6/2014 | Maxik | F21V 29/02 362/373 |
| 2017/0138582 A1* | 5/2017 | Kim | F21V 29/673 |
| 2017/0167712 A1* | 6/2017 | Melzner | F21V 29/58 |
| 2017/0212560 A1* | 7/2017 | Tsai | G06F 1/20 |
| 2017/0215301 A1* | 7/2017 | Zheng | G06F 1/20 |
| 2017/0332522 A1* | 11/2017 | Ushijima | H05K 7/20272 |
| 2017/0339802 A1* | 11/2017 | Pan | F28D 15/00 |
| 2017/0347487 A1* | 11/2017 | Rudnicki | H05K 7/20272 |
| 2017/0351305 A1* | 12/2017 | Wei | F28D 15/00 |
| 2017/0367217 A1* | 12/2017 | Xiao | G06F 1/203 |
| 2018/0003360 A1* | 1/2018 | Wen | F21V 7/0033 |
| 2018/0014434 A1* | 1/2018 | Craft, Jr. | H05K 7/20736 |
| 2018/0017245 A1* | 1/2018 | Wang | F21V 29/673 |
| 2018/0023594 A1* | 1/2018 | Sheng | F04D 1/06 165/104.31 |
| 2018/0027696 A1* | 1/2018 | Franz | G06F 1/20 361/679.47 |
| 2018/0045388 A1* | 2/2018 | McDowell | F21V 29/15 |
| 2018/0092249 A1* | 3/2018 | Chiu | H05K 7/20263 |
| 2018/0139865 A1* | 5/2018 | Draht | H05K 7/20254 |
| 2018/0199466 A1* | 7/2018 | Thiessen | F04D 13/0666 |
| 2018/0213687 A1* | 7/2018 | Lu | G06F 1/20 |
| 2018/0246550 A1* | 8/2018 | Inaba | G06F 1/20 |
| 2019/0064890 A1* | 2/2019 | Donachy | G06F 1/206 |
| 2019/0107122 A1* | 4/2019 | Shen | F04D 13/0673 |
| 2019/0212077 A1* | 7/2019 | Lan | H05K 7/20272 |
| 2019/0281725 A1* | 9/2019 | Byers | H05K 7/20763 |

* cited by examiner

HEAT DISSIPATING DEVICE HAVING COLORED LIGHTING AND PERSISTENCE EFFECT

BACKGROUND

Field

Embodiments disclosed are related to heat dissipation devices, and more particularly, to heat dissipating devices having light emitting devices.

Description of Related Art

With the increase of the processing speed and performance of electronic components, such as central processing units (CPU), the amount of heat generated during operation of the electronic component increases. The heat generation increases the temperature of the electronic component and, if the heat cannot be dissipated effectively, the reliability and performance of the electronic component is reduced. To prevent overheating of the electronic component, typically, a heat dissipating device is used for cooling the electronic component and, thereby maintain normal operation of the electronic component.

Users of computers usually spend long time at a task, and thus can be fatigued. As such, it is generally desirable to provide a computer housing with an aesthetically pleasing appearance to provide a more relaxed environment for the user.

SUMMARY

Various aspects of the present disclosure provide a heat dissipating device for dissipating heat generated by electronic components.

According to one aspect of the present disclosure, the heat dissipating device includes a bottom assembly, a first light guide positioned on the bottom assembly, a first light assembly positioned on the first light guide; and an outer cover positioned on the bottom assembly and at least partially enclosing the bottom assembly, the first light guide, and the first light assembly The outer cover defines a first opening on a top surface thereof, at least a portion of the first light guide is received in the first opening, and light from the first light assembly is emitted from the heat dissipating device through the exposed portion of the first light guide.

According to another aspect of the present disclosure, the heat dissipating device includes a bottom assembly, a first light guide positioned on the bottom assembly and including a circular protrusion on an upper surface thereof and two curved protrusions extending radially from an outer circumferential end of the first light guide, a first light assembly positioned on the first light guide; and an outer cover positioned on the bottom assembly and at least partially enclosing the bottom assembly, the first light guide, and the first light assembly. The outer cover defines a first opening on a top surface thereof, and defines a second opening and a third opening on an outer circumferential surface of the outer cover and adjacent the top surface, at least a portion of the first light assembly is received in the first opening, the two curved protrusions are received in a corresponding one of the second opening and the third opening, and light from the first light assembly is emitted from the heat dissipating device through the portion of the first light assembly in the first opening and through the two curved protrusions.

According to another aspect of the present disclosure, the heat dissipating device includes a bottom assembly, a first light guide positioned on the bottom assembly and including a circular protrusion on an upper surface thereof and two curved protrusions extending radially from an outer circumferential end of the first light guide, a first light assembly positioned on the first light guide, a second light guide including a first curved part and a second curved part each disposed in the bottom assembly, a second light assembly disposed on the second light guide, and an outer cover positioned on the bottom assembly and at least partially enclosing the bottom assembly, the first light guide, the first light assembly, the second light guide, and the second light assembly. The outer cover defines a first opening on a top surface thereof, a second opening and a third opening on an outer circumferential surface of the outer cover and adjacent the top surface, and a fourth opening and a fifth opening on the outer circumferential surface of the outer cover and adjacent a lower end of the outer cover, at least a portion of the first light assembly is received in the first opening, the two curved protrusions are received in a corresponding one of the second opening and the third opening, the first and second curved parts are received in a corresponding one of the fourth opening and the fifth opening, and light from the first light assembly is emitted from the heat dissipating device through the portion of the first light assembly in the first opening, through the two curved protrusions, and through the first and second curved parts.

According to another aspect of the present disclosure, the heat dissipating device includes a bottom assembly, a first light guide positioned on the bottom assembly, a first light assembly positioned adjacent a circumferential end surface of the first light guide, and an outer cover positioned on the bottom assembly and at least partially enclosing the bottom assembly, the first light guide, and the first light assembly. The outer cover defines a first opening on a top surface thereof, at least a portion of the first light guide is received in the first opening, and light from the first light assembly is emitted from the heat dissipating device through the portion of the first light guide received in the first opening.

According to another aspect of the present disclosure, the heat dissipating device includes a bottom assembly, a first light guide positioned on the bottom assembly, a first light assembly positioned on the first light guide, and an outer cover positioned on the bottom assembly and at least partially enclosing the bottom assembly, the first light guide, and the first light assembly. The outer cover defines a first opening on a top surface thereof, at least a portion of the first light guide is received in the first opening, and light from the first light assembly is emitted from the heat dissipating device through the exposed portion of the first light guide. The bottom assembly includes an inlet unit fluidly coupled to an inlet of the heat dissipating device, and a base including a stator portion and a rotor portion, the rotor portion including a plurality of blades disposed on a top circular plate of the rotor portion. Two of (1) the plurality of blades, (2) an inner circumferential surface of the inlet unit and a top surface of a rim of the inlet unit, and (3) the top circular plate have contrasting colors with respect to each other.

BRIEF DESCRIPTION OF THE DRAWINGS

The following figures are included to illustrate certain aspects of the embodiments, and should not be viewed as exclusive embodiments. The subject matter disclosed is capable of considerable modifications, alterations, combinations, and equivalents in form and function, as will occur to those skilled in the art and having the benefit of this disclosure.

DETAILED DESCRIPTION

Embodiments described herein are directed to a computer housing having removable components for changing an appearance thereof as desired by a user.

Figure 1:
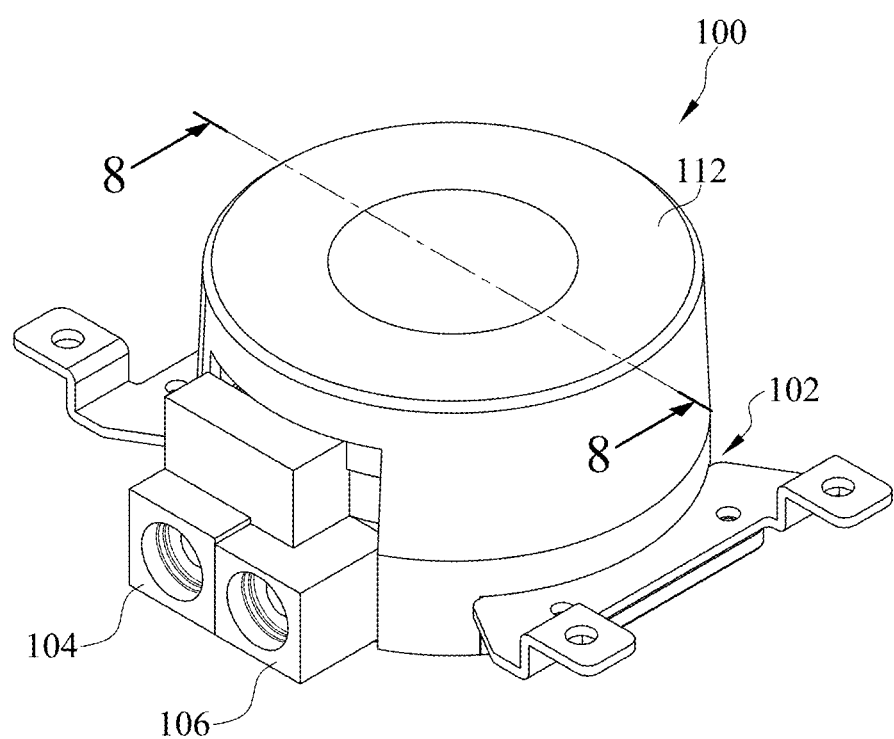
FIG. 1 is a perspective view of an exemplary heat dissipating device, according to embodiments disclosed.

FIG. 1 is a perspective view of an exemplary heat dissipating device 100, according to embodiments disclosed. Referring to FIG. 1, the heat dissipating device 100 includes a bottom assembly 102 having an inlet 104 and an outlet 106 each fluidly coupled to the bottom assembly 102. The heat dissipating device 100 includes an outer cover 112 that forms the top portion of the heat dissipating device 100 and the bottom assembly 102 may be received within the outer cover 112. In an embodiment, the outer cover 112 is made of, for example, but not limited to, a transparent or translucent material that permits light to pass therethrough. For example, the outer cover 112 is made of glass, plastic, a combination thereof, and the like.

Figure 2A:
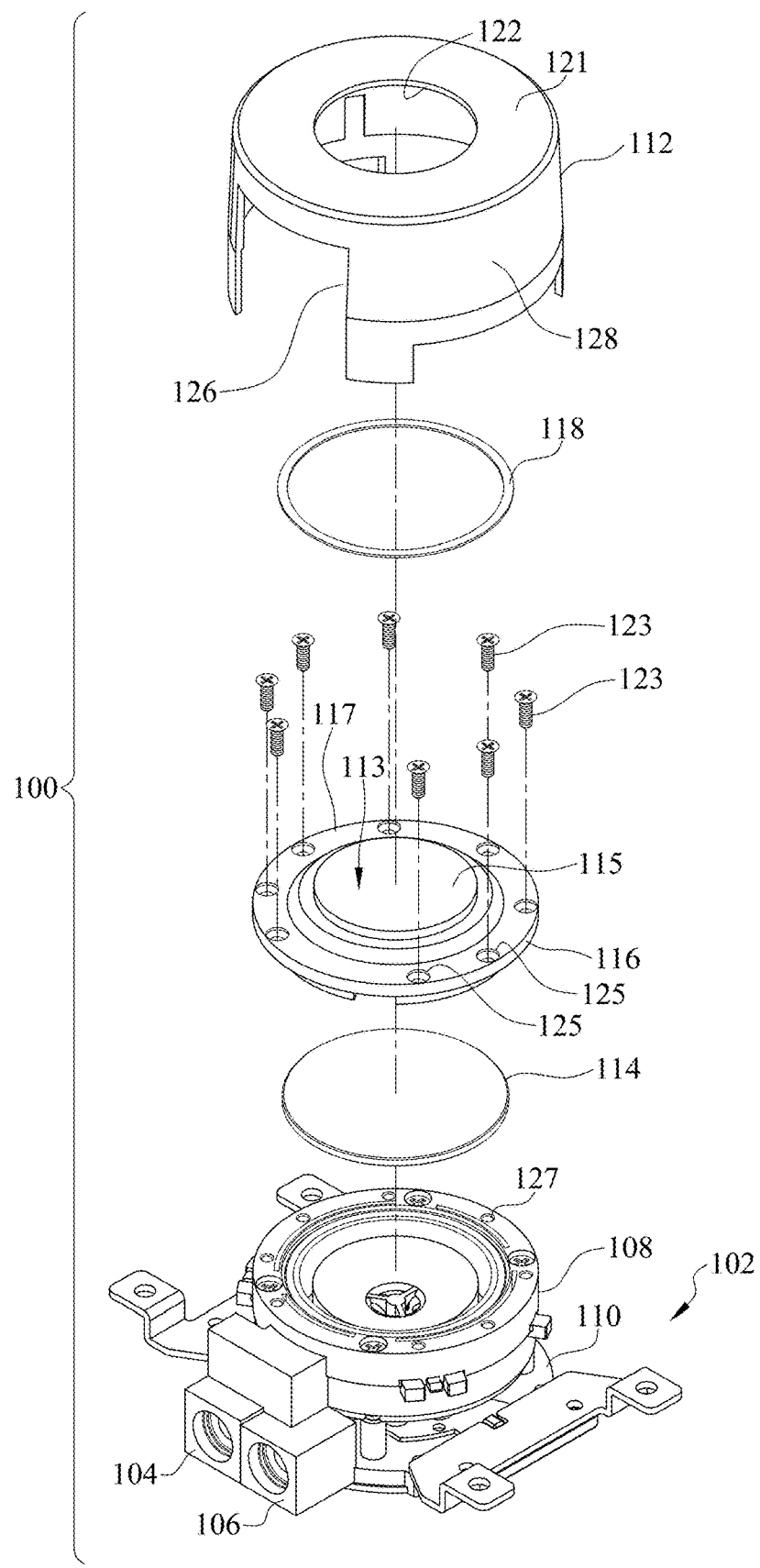
FIGS. 2A, 2B, and 3 are exploded views of the heat dissipating device of FIG. 1, according to embodiments disclosed.
Figure 2B:
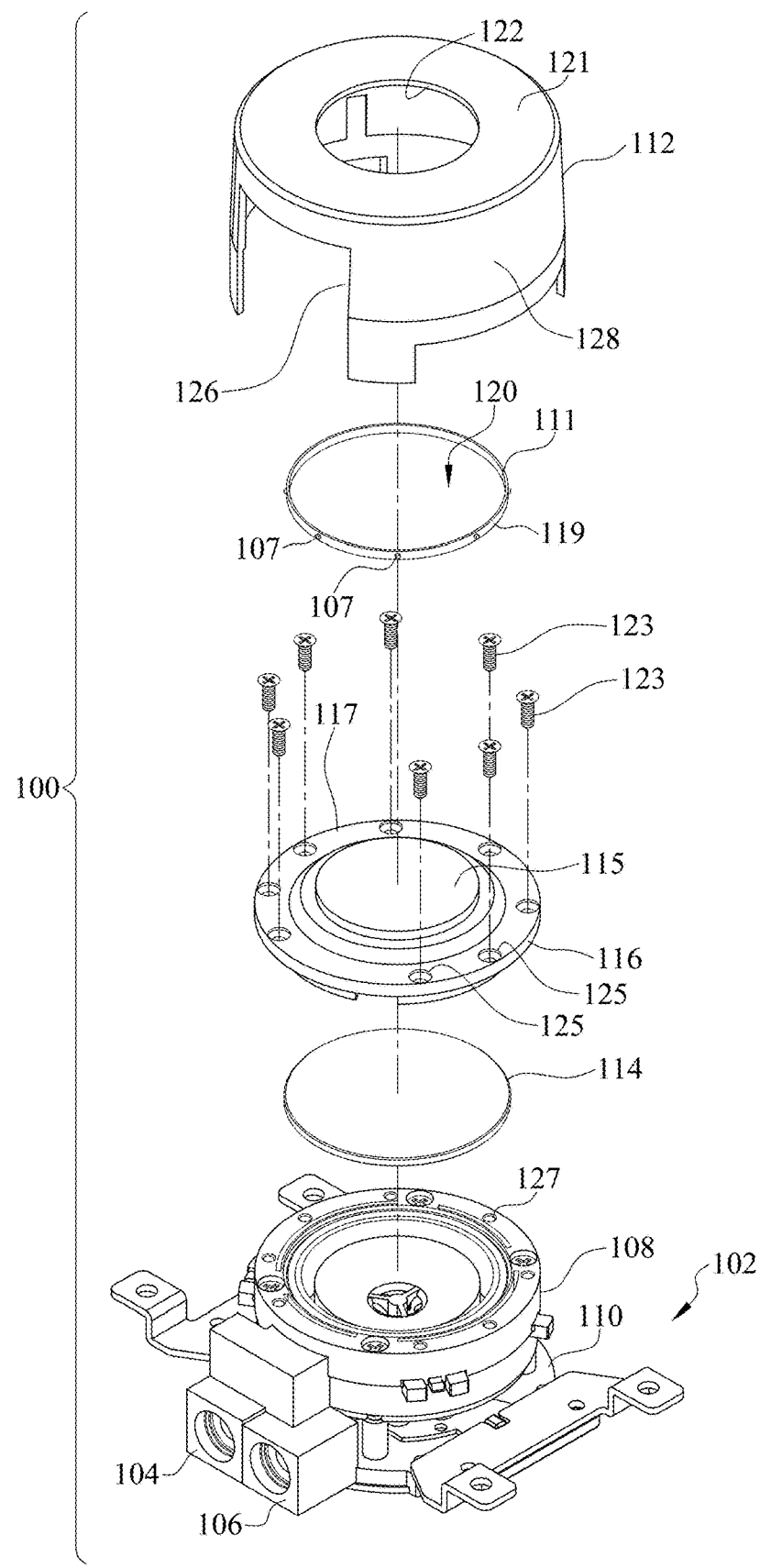
Figure 3:
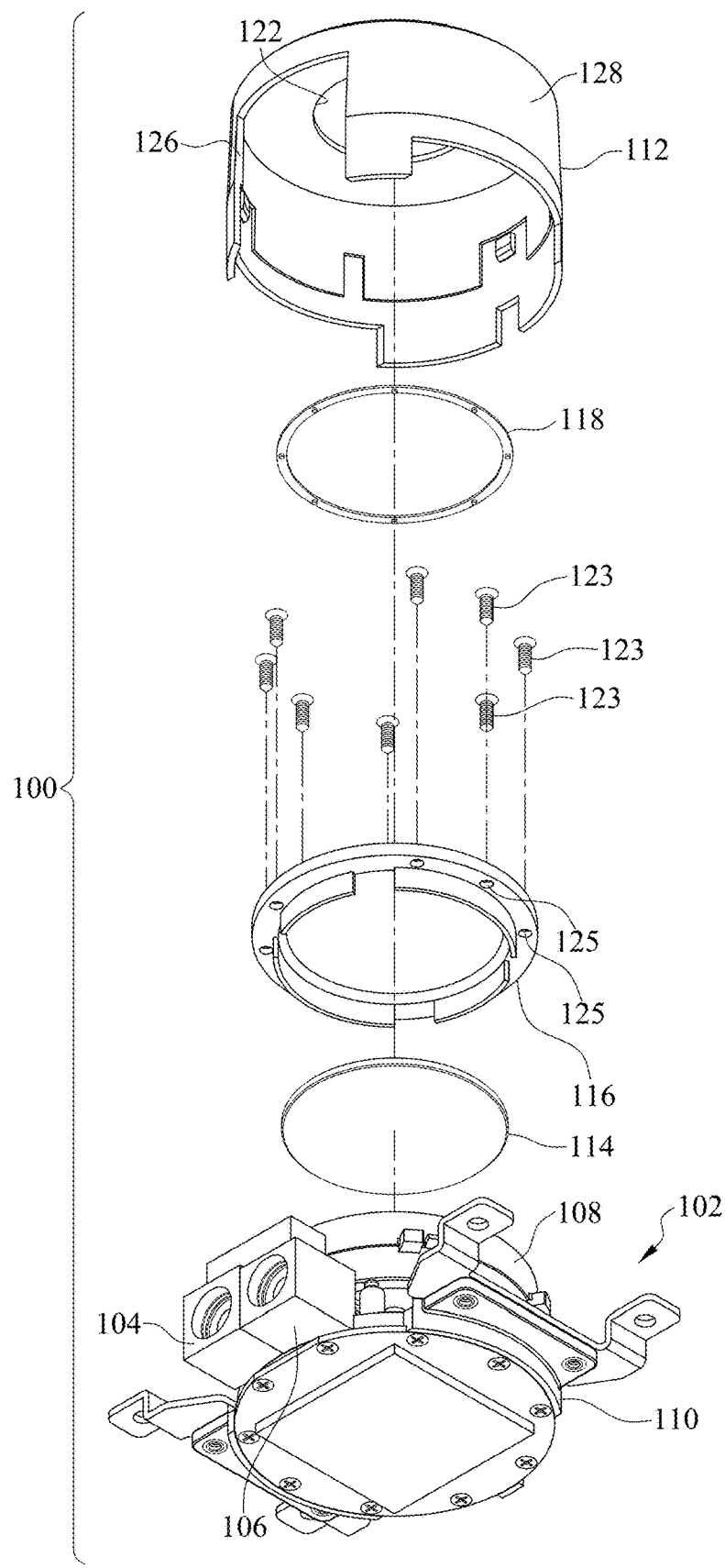

FIGS. 2A, 2B, and 3 are exploded views of the heat dissipating device 100, according to embodiments disclosed. As illustrated, the heat dissipating device 100 includes a stacked arrangement of the bottom assembly 102, a glass cover 114, a light guide 116, a light assembly 118, and the outer cover 112. The bottom assembly 102 includes a heat exchange unit 110 and a pumping unit 108 disposed on the heat exchange unit 110 and fluidly coupled thereto. As discussed below, the inlet 104 and the outlet 106 are also fluidly coupled to the heat exchange unit 110 and the pumping unit 108. The glass cover 114 is disposed on the pumping unit 108. In an embodiment, the glass cover 114 limits water vapor generated in the bottom assembly 102 from reaching the light guide 116. Specifically, referring to FIG. 3, the glass cover 114 is received in the bottom portion of the light guide 116. When assembled, the light guide 116 is disposed on the bottom assembly 102 and the glass cover 114 is located therebetween. In an embodiment, the glass cover 114 is omitted and a thin film that is at least translucent covers the bottom portion of the light assembly 116. In another embodiment, the glass cover 114 is omitted and a thickness of the light guide 116 is increased (e.g., in the axial direction). In an example, the thickness of the light guide 116 may be about 7 mm to about 13 mm. The increased thickness limits water vapor generated in the bottom assembly 102 from entering other portions of the heat dissipation device 100.

The light guide 116 has a plate shaped structure made from a transparent or translucent material so that light passes therethrough. The light guide 116 reflects and/or transmits the light from the light assembly 118. An upper surface 117 of the light guide 116 includes a circular protrusion 115 centrally located in the upper surface 117. The light guide 116 is coupled to the bottom assembly 102, more specifically, to the pumping unit 108, using fasteners 123 (e.g., screws, bolts, pins, etc.) that are received in corresponding holes 127 defined in the pumping unit 108 via through-holes 125 defined in the light guide 116.

As illustrated in FIG. 2A, the light assembly 118 is an annular disk-shaped structure (similar to a washer) that includes a plurality of light emitting devices (discussed below with reference to FIG. 9). The light emitting devices may be disposed in the upper or lower surface (with reference to the orientation in FIGS. 2A and 3) of the light assembly 118. The light assembly 118 is disposed on the light guide 116 about the circular protrusion 115. In other words, the circular protrusion 115 is received within the central opening defined in the light assembly 118 when the light assembly 118 is disposed on the light guide 116. The light assembly 118, and thus the plurality of light emitting devices included therein, is stationary and does not rotate when the rotor portion 136 (discussed below) rotates. The light assembly also includes the control circuit (discussed below with reference to FIG. 9) for powering and controlling an operation of the light emitting devices. In an embodiment, the plurality of light emitting devices may be arranged at regular intervals on the light assembly. However, in other embodiments, the plurality of light emitting devices may be arranged at irregular (or random) intervals. In an embodiment, the light emitting devices are light emitting diodes (LEDs). However, the light emitting devices are not limited to LEDs and also include other types of light emitting devices, without departing from the scope of the disclosure. The plurality of light emitting devices may include at least one light emitting device emitting red light, at least one light emitting device emitting green light, and/or at least one light emitting device emitting blue light. Alternatively or optionally, the plurality of light emitting devices may emit colors other than red, green, and blue. For example, the plurality of light emitting devices may include white color and/or yellow color light emitting devices.

FIG. 2B illustrates another embodiment of a light assembly 111, according to embodiments disclosed. The light assembly 111 has a hollow cylinder shape having vertical circumferential sidewalls 119 and a central opening 120. The light assembly 111 may be coupled to the circumferential end surface 109 (FIG. 2A) of the light guide 116. The light assembly 111 may include a plurality of light emitting devices 107 disposed in the sidewalls 119 at regular or random intervals.

During operation, light from the light emitting devices in the light assembly 111 or 118 passes through the light guide 116 is reflected and/or transmitted by the light guide 116, thereby "filling" the light guide with the light from the light emitting devices.

The outer cover 112 includes an opening 122 centrally located on a top surface 121 thereof. The opening 122 is sized or otherwise configured to receive the circular protrusion 115 when the heat dissipating device 100 is assembled. When assembled, the top surface 113 of the circular protrusion 115 is flush with the top surface 121 of the outer cover 112. The outer cover 112 includes an opening 126 defined in the outer circumferential surface 128 of the outer cover 112. The opening 126 is sized or otherwise configured to receive the inlet 104 and outlet 106. When assembling, the outer cover 112 is coupled to the bottom assembly 102 using a snap-fit type connection.

Figure 4:
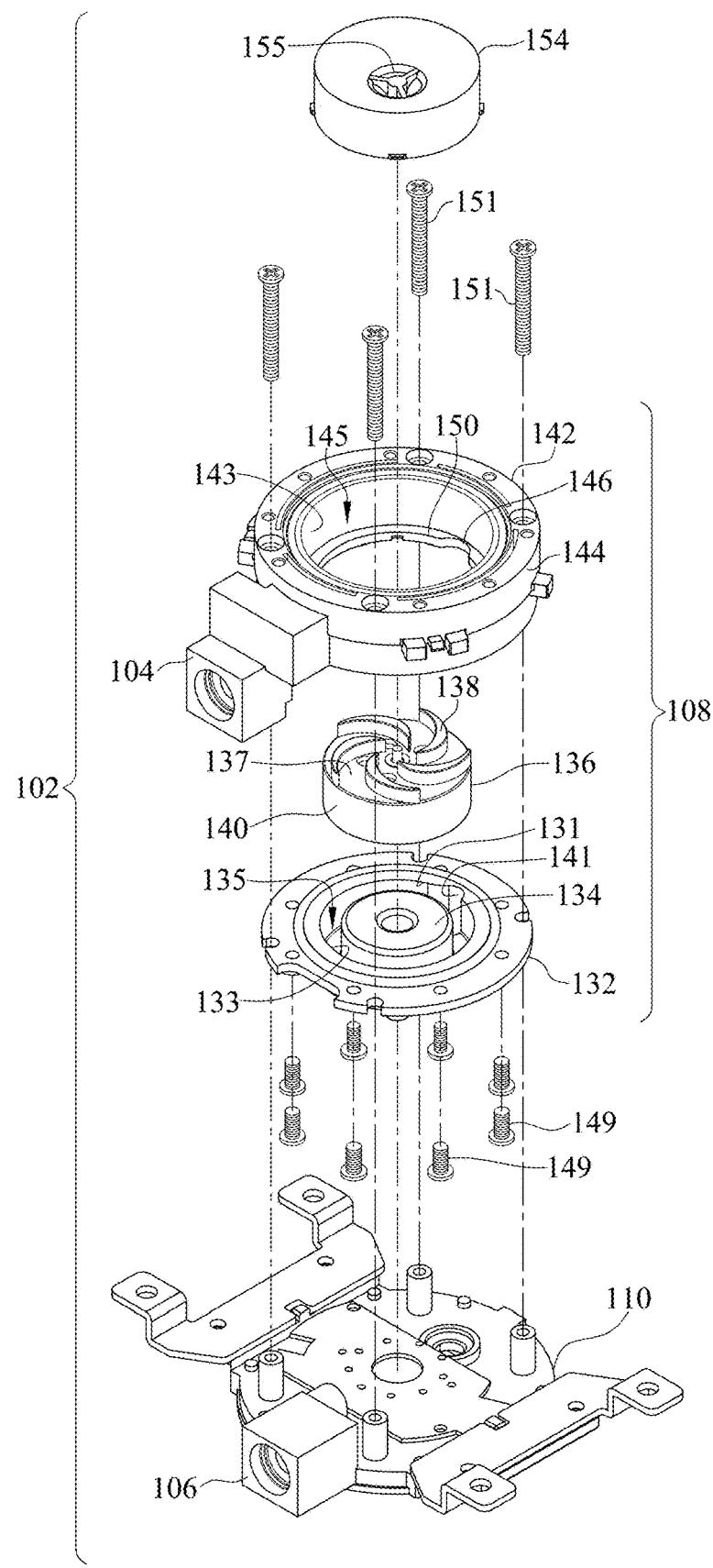
FIGS. 4 and 5 are exploded views of the bottom assembly of FIG. 1, according to embodiments disclosed.
Figure 5:
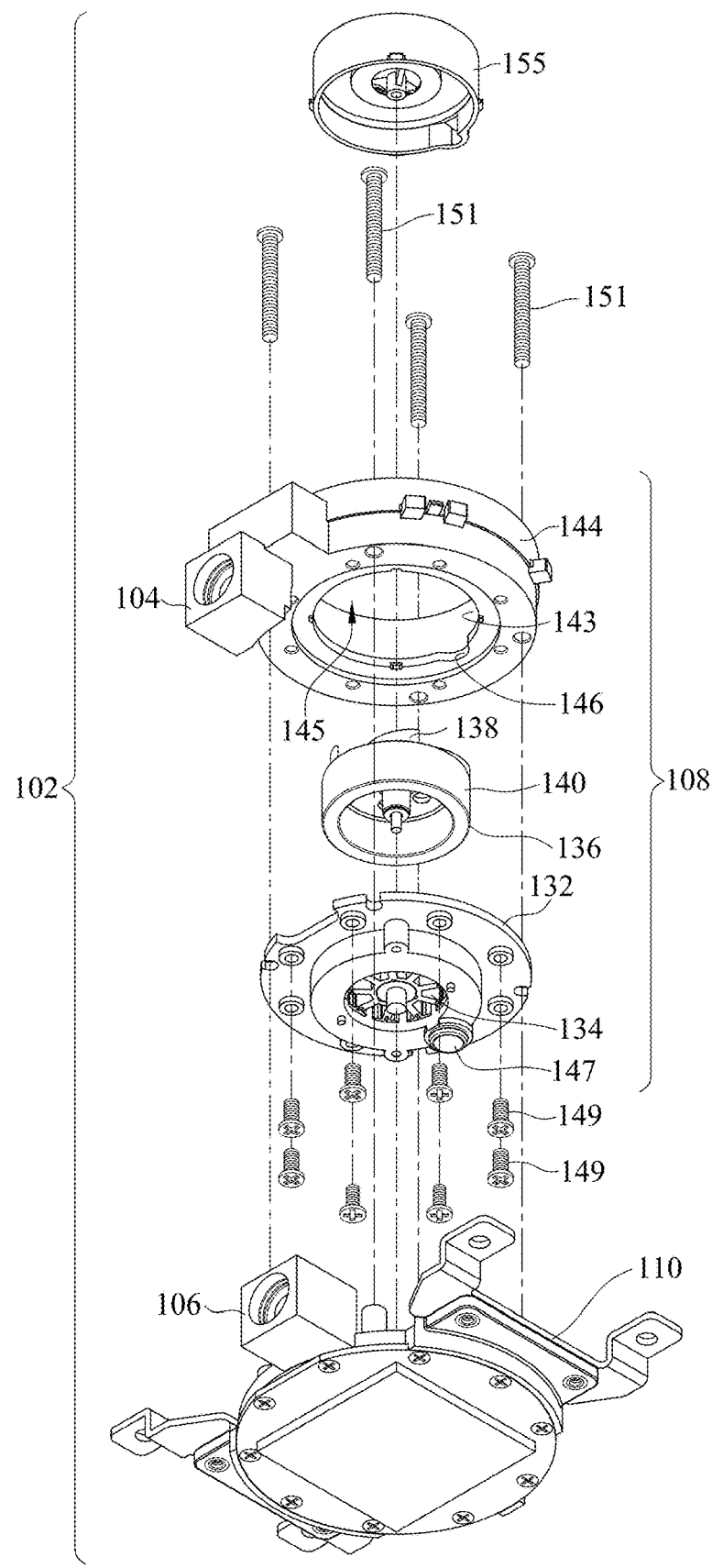

FIGS. 4 and 5 are exploded views of the bottom assembly 102, according to embodiments disclosed. Also illustrated in FIGS. 4 and 5 is an exploded view of the pumping unit 108. The pumping unit 108 houses the motor of the heat dissipating device 100. The motor is used to circulate cooling liquid within the heat dissipating device 100 for cooling an electronic component attached thereto. The pumping unit 108 includes a base 132 having a generally cylindrical body defining a central opening 133. The stator portion 134 of the motor is located in the opening 133. A gap 135 is defined between the stator portion 134 and an inner circumferential surface 131 of the base 132. The inner circumferential surface 131 defines a recess 141 (or a concavity) extending axially in the gap 135. The recess 141 is fluidly coupled to an opening 147 in the bottom of the base 132.

The rotor portion 136 is disposed on the stator portion 134 and in the gap 135. The rotor portion 136 has a generally cylindrical body including a top circular plate 137 and circular sidewalls 140 coupled to the top circular plate 137 along its circumference. A plurality of blades 138 that impart motion to the cooling liquid in the heat dissipating device 100 are disposed on the top circular plate 137. The circular sidewalls 140 define a cavity that is sized or otherwise configured to receive the stator portion 134.

The pumping unit 108 also includes an inlet unit 142 that is disposed on the base 132. The inlet unit 142 includes a generally cylindrical body having a central opening 145 defined by circular (or curved) sidewall 144 of the inlet unit 142. The inlet 104 of the heat dissipating device 100 opens on the inner circumferential surface 143 of the sidewall 144 and is in fluid communication with the opening 145. The inlet unit 142 is disposed on the base 132 such that the rotor portion 136 is received in the opening 145.

A circular rim 150 protrudes radially inward into the opening 145 from an inner circumferential surface of the sidewall 144. The rim 150 is coupled to the bottom of the inlet unit 142. The rim 150 defines a recess (or a concavity) 146.

The bottom assembly 102 also includes a liquid guiding unit 154 disposed in the opening 145 about the rotor portion 136 and supported by the base 132. The liquid guiding unit 154 has a central opening 155 through which cooling liquid flows into a pump chamber (see below).

When assembled, the stator portion 134 is received in the rotor portion 136 and the inlet unit 142 is positioned on the base 132. The inlet unit 142 and the base 132 are coupled together using fasteners 149 and cooperatively form a pump chamber of the pumping unit 108. The pump chamber houses the stator portion 134 and the rotor portion 136. The base 132 forms the base (or bottom) of the pump chamber and the sidewalls 144 form the sides of the pump chamber. The recess 146 and the recess 141 are in fluid communication with each other. The inlet unit 142 is coupled to the heat exchange unit 110 using fasteners 151.

Figure 6:
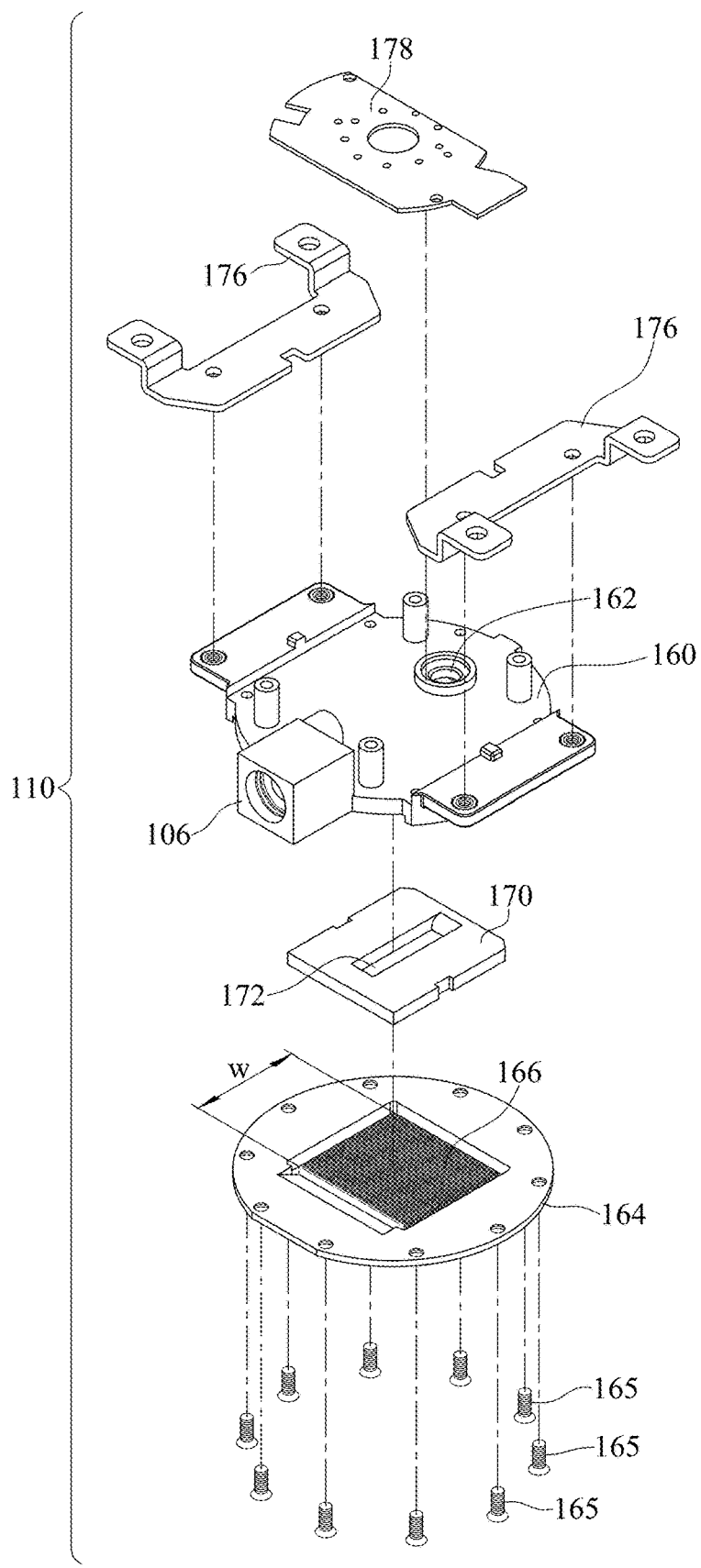
FIGS. 6 and 7 are exploded views of the heat exchange unit of FIG. 1, according to embodiments disclosed.
Figure 7:
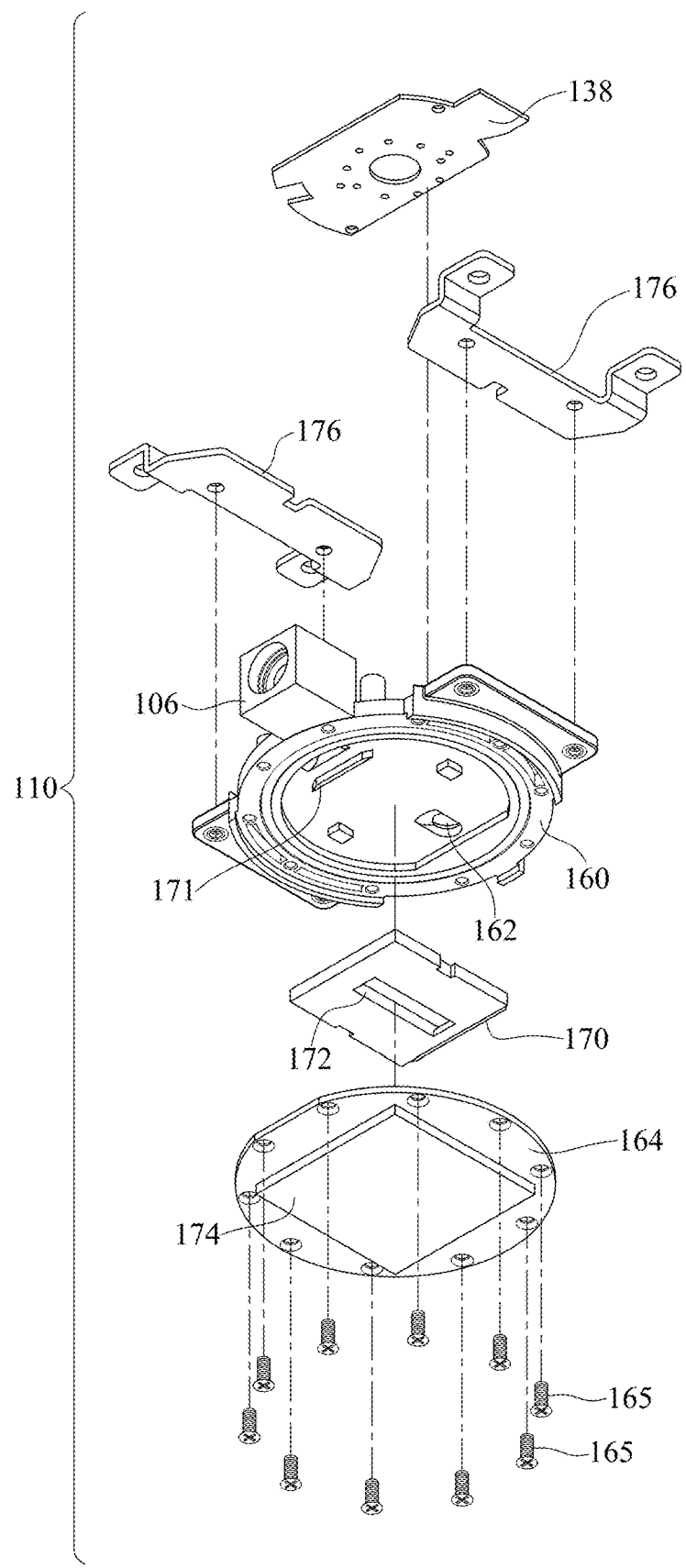

FIGS. 6 and 7 are exploded views of the heat exchange unit 110, according to embodiments disclosed. The heat exchange unit 110 includes a cover plate 160 defining a through opening 162 and the outlet 106 of the heat dissipating device 100. The heat exchange unit 110 further includes a circular base plate 164 including a heat exchanger. In an embodiment, and as illustrated, the heat exchanger includes an array of a plurality of longitudinally extending fins 166 disposed in the central portion of the base plate 164. However, in other embodiments, the heat exchange unit 110 may include pins, columns, or any other structure of a desired shape and size for dissipating heat, without departing from the scope of the disclosure. The fins 166 extend transversely on the base plate 164 along the length (or width) thereof, and are arranged parallel to each other and perpendicular to the base plate 164. However, in other embodiments, some or all of the plurality of fins 166 are non-parallel to each other and arranged on the base plate 164 at an angle less than 90°. The base plate 164 (or at least a portion thereof) includes a thermally conductive material, such as a metal including copper, aluminum etc., or non-metal thermally conductive material, such as graphite etc. The fins 166 (or at least a portion thereof) also include a thermal conductive material. In an embodiment, the fins 166 and the base plate 164 are integrally formed as a single piece. In another embodiment, the fins 166 are coupled to the base plate 164 using known techniques.

The heat exchange unit 110 also includes a sealing cover 170 having an opening 172. The opening 172 is shaped as an elongated slot extending perpendicular (or transversely) to the fins 166. The opening 172 extends the entire width W of the fins 166. Referring to FIG. 7, the bottom surface (e.g., the surface of the base plate 164 opposite to the surface having the fins 166) of the base plate 164 includes a coupling area 174 to which the electronic component from which heat is to be dissipated is attached. Specifically, the electronic component from which heat is to be dissipated is attached to the bottom surface using a thermally conductive material (e.g., thermal grease) in order to transfer the heat generated from the electronic component to the base plate 164.

When the heat exchange unit 110 is assembled, the sealing cover 170 is arranged on the fins 166 and coupled to the base plate 164, thereby forming a heat exchange chamber that encloses the fins 166. The seal between the sealing cover 170 and the base plate 164 is liquid-tight preventing liquid in the heat exchange chamber from leaking. The cover plate 160 is coupled to the base plate 164 using fasteners 165 (FIG. 7) and such that the opening 162 is in fluid communication with the opening 172.

The heat exchange unit 110 is coupled to the circuit board including the electronic component from which heat is to be dissipated using connection members 176 coupled to the cover plate 160. The motor control circuit 178 including a circuit board for controlling the operation of the motor is arranged on the cover plate 160.

During operation of the heat dissipating device 100, cooling liquid is received into the opening 145 via the inlet 104. The liquid guiding unit 154 guides the cooling liquid into the pump chamber via the opening 155. The rotor portion 136 imparts motion to the cooling liquid. The cooling liquid then flows through the recesses 146 and 141 and into the heat exchange unit 110 via the opening 147. The cooling liquid is received from the opening 147 into the heat exchange chamber via the openings 162 and 172. The cooling liquid contacts the fins 166 and heat is exchanged between the fins 166 and the cooling liquid thereby raising the temperature of the cooling liquid. The flow of the cooling liquid into the heat exchange chamber due to the operation of the motor forces the heated liquid to exit the heat exchange chamber via the opening 172 and flow into an opening 171 (FIG. 7) in the cover plate 160. The opening 171 is adjacent the outlet 106 of the heat dissipating device 100, and the heated liquid exits the heat dissipating device 100 via the outlet 106.

As mentioned above, during operation, the light from the light emitting devices is reflected and/or transmitted by the light guide 116, thereby "filling" the light guide 116 with the light. The blades 138 also reflect the light from the light emitting devices. The flow of liquid also disperses light. These factors result in an aesthetically pleasing light effect. In an embodiment, the colors of the light emitting devices are varied based on the rotating speed of the rotor portion 136. In another embodiment, the light emitting devices are turned ON and OFF. The frequency (referred to as the ON/OFF frequency) at which the light emitting devices are turned ON and OFF depends on the rotational frequency of the rotor portion 136. During operation, by controlling the frequency of the light emitting devices, the rotor portion 136 appears as if the rotor portion 136 is rotating at a lower speed than the actual speed of rotation of the rotor portion 136. This visual effect is achieved by setting the ON/OFF frequency of the light emitting devices to be different than integer multiple of the rotating speed of the rotor portion 136. In an embodiment, the blades 138 are arched (or arcuate) structures that are curved or otherwise oriented opposite to the direction of rotation of blades 138. In another embodiment, the top circular plate 137, and the inner circumferential surface 143 and top surface 153 of the rim 150 have contrasting colors with respect to each other to increase the aesthetic effect. In an embodiment, the plurality of blades 138 and the top circular plate 137 have contrasting colors with respect to each other to increase the aesthetic effect. In an embodiment, the plurality of blades 138, and the inner circumferential surface 143 and top surface 153 of the rim 150 have contrasting colors with respect to each other to increase the aesthetic effect. In addition to increasing the aesthetic effect, the contrasting colors improve the relative reflectance (or reflectivity) of the blades 138, the inner circumferential surfaces 131 and 143, top surface 153 of rim 150, and the top circular plate 137. For example, if plurality of blades 138 are white and top circular plate 137 is black, the blades 138 reflect more light compared to the top circular plate 137. Likewise, if the top circular plate 137 is white and each of the inner circumferential surface 143 and the top surface 153 of the rim 150 are of a darker color (e.g., black), the top circular plate 137 will reflect comparatively more light. Similarly, if the plurality of blades are white and the each of the inner circumferential surface 143 and the top surface 153 of the rim 150 are of a darker color (e.g., black), the top circular plate 137 will reflect comparatively more light. In an example, two of (1) the plurality of blades 138, (2) an inner circumferential surface 143 of the inlet unit 142 and the top surface 153 of the rim 150 of the inlet unit 142, and (3) the top circular plate 137 have contrasting colors with respect to each other. The top surface 113 of the circular protrusion 115 is transparent (or at least translucent) and, as a result, the rotating motion of the rotor portion 136 and the flow of the liquid inside the heat dissipating device 100 are observed. Further, the light exits via the top surface 113 of the circular protrusion 115.

Figure 8:
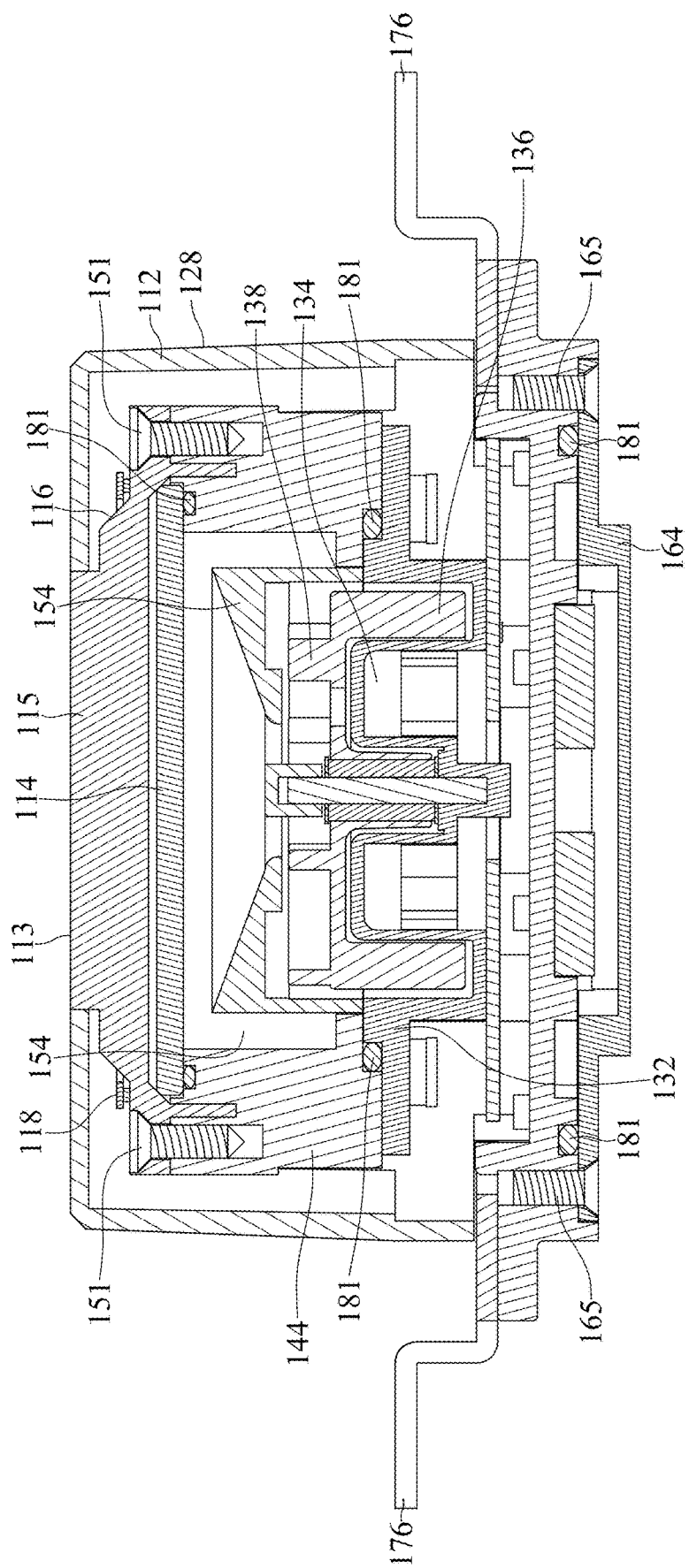
FIG. 8 illustrates a cross-sectional view of the heat dissipating device of FIG. 1 taken along the line 8-8.

FIG. 8 illustrates a cross-sectional view of the heat dissipating device 100 of FIG. 1 taken along the line 8-8. The cross-sectional view illustrates the arrangement of the different components in the assembled state of the heat dissipating device 100. As illustrated, sealing elements 181 (e.g., O-rings) are used at the interface of different components to create a liquid-tight seal and minimize leaks.

Figure 9:
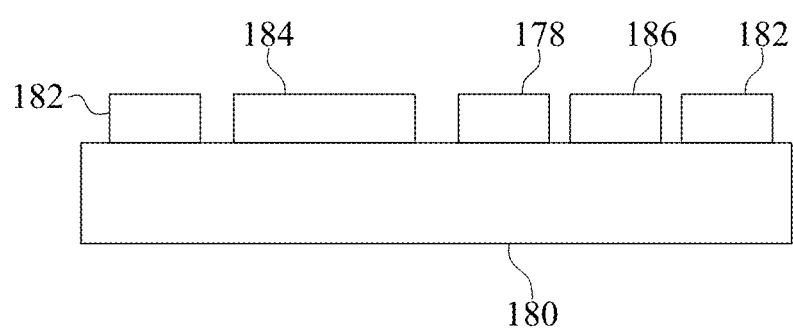
FIG. 9 schematically illustrates a circuit board included in the light assembly, according to embodiments disclosed.

FIG. 9 schematically illustrates a circuit board 180 included in the light assembly 118, according to embodiments disclosed. As illustrated, the circuit board 180 includes plurality of light sources 182, a power supply 184, and a processor 186. The circuit board 180 is a printed circuit board, a flexible circuit board, or the like, and is configured (e.g., has a shape and size) to be installed in the light assembly 118. In an example, the circuit board 180 has an annular or ring shape corresponding to the shape of the light assembly 118. According to embodiments, the power supply 184 provides a DC source, which may be a power conversion circuit such as an AC-DC converter or a DC-DC converter, a connection circuit for receiving power form an external power source (not shown) and transmitting the received power for on-board use, or a battery. The circuit board 180 not only supports various electronic components disposed thereon but also includes various conductive patterns for transmitting signals among the various electronic components. The plurality of light sources 182 are disposed on the circuit board 180, and each includes one or more light emitting devices. The circuit board 180 is affixed to the light assembly 118, and is stationary with respect to rotation of the plurality of fan blades 138. Stated otherwise, the plurality of light sources 182 are stationary and independent from the rotation of the plurality of fan blades 138.

Although FIG. 9 shows that the various elements including the power supply 184, the processor 186, and the plurality of light sources 182 are disposed on a same surface of the circuit board 180, the present disclosure is not limited thereto. In some other embodiments, the various elements can be disposed on opposite surfaces of the circuit board 180 for integration.

Figure 10:
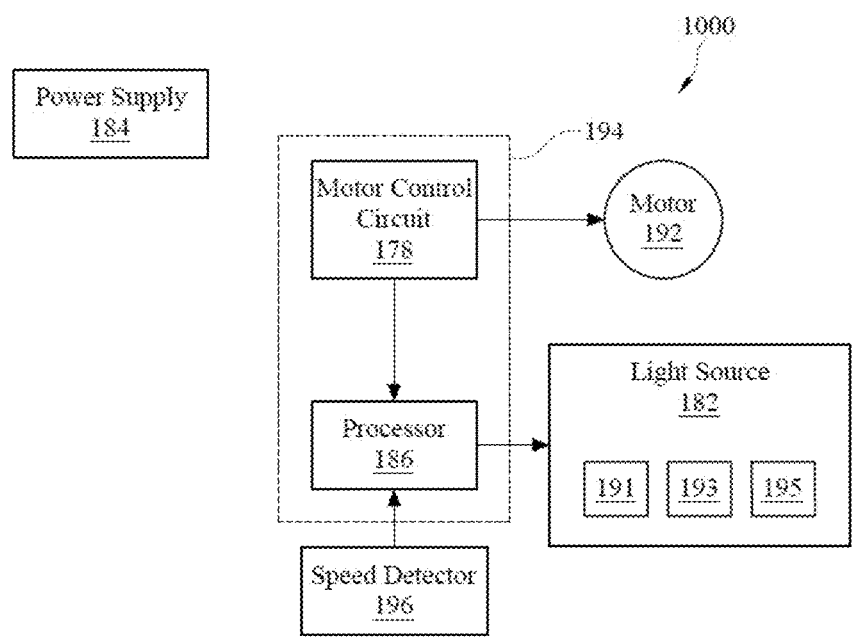
FIG. 10 shows a schematic circuit for controlling an operation of the plurality of light sources, according to embodiments disclosed.

FIG. 10 shows a schematic circuit 1000 for controlling an operation of the plurality of light sources 182, according to embodiments disclosed. As illustrated, a power supply 188, motor control circuit 178, a motor 192 (comprised of the stator portion 134 and rotor portion 136), the processor 186, and a plurality of light sources 182 (one shown) are depicted in a schematic circuit. As an example, the light source 182 is depicted as including red, green, and blue color light emitting devices 191, 193, and 195. Alternatively or optionally, the plurality of light sources 182 may include other light sources emitting other colors other than red, green, and blue. For example, the plurality of light sources 182 may include white color and/or yellow color light sources. In an embodiment, one and only one light source 182 rather than a plurality of light sources may be implemented. Although illustrated as separate components, some of the components a power supply 188, motor control circuit 178, a motor 192, the processor 186, and a plurality of light sources 182 may be combined into a single component. For instance, in an embodiment, the motor control circuit 178 may be integrated into the processor 186, and may collectively be referred to a processor 194.

The power supply 188 may be a power conversion circuit such as an AC-DC converter or a DC-DC converter, a connection circuit for receiving power from an external power source (not shown), or a battery. The power supply 188 directly or indirectly supplies power to various electronic components of the heat dissipating device 100 that require power, including, but not limited to, the motor control circuit 178, the motor 192, the processor 186, and the plurality of light sources 182 illustrated in FIG. 10.

The motor control circuit 178 provides a control signal such as a pulse width modulation (PWM) signal to control a rotational speed of the motor 192 including the stator portion 134 and rotor portion 136 (FIGS. 4 and 5). The motor control circuit 178 transmits to the processor 186 a signal indicative of the rotational speed of the motor 192 (or, more specifically, the rotor portion 136). The motor control circuit 178 may be configured to be an analog circuit, or a digital circuit, or a combination thereof, and may be implemented, for example, by a microprocessor, an application-specific integrated circuit (ASIC), or a field-programmable gate array (FPGA).

The processor 186 receives the signal indicative of the rotational speed of the motor 192 from the motor control circuit 178, generates a control signal indicative of an on/off frequency of at least one of the plurality of light sources 182 based at least on the received rotational speed of the motor 192, and transmit the control signal to at least one of the plurality of light sources 182. The received rotational speed from the motor control circuit 178 may be measured in revolutions per minute (rpm).

In an embodiment, the processor 186 is configured to generate the control signal indicative of the on/off frequency of at least one of the plurality of light sources 182 using $$f = \frac{R}{60} \times N \times C \qquad \text{Equation (1)}$$

wherein, f is the on/off frequency of at least one of the plurality of light sources 182, R is the received rotational speed of the motor 192 in rpms, N is the number of the plurality of blades 138, and C is a constant which can be a natural number in some embodiments.

The plurality of light sources 182 are simultaneously turned ON or OFF at the on/off frequency based on the control signal indicative of the on/off frequency provided by the processor 186. In some embodiments, the control signal is applied to a pulse width modulation (PWM) circuit to modulate the on/off frequency of one or more the plurality of light sources 182. In an embodiment, the light sources 182 may illuminate the plurality of fan blades 138 and may be turned ON and OFF at the frequency determined by the processor 186 based on Equation (1) such that the plurality of fan blades 138 may appear stationary to a user, although the fan blades 138 are rotating at a high speed. This static display may be obtained by controlling a value of C in Equation 1.

In an embodiment, each of the plurality of light sources 182 is controlled to turn on/off by a common control signal provided by the processor 186.

In another embodiment, the plurality of light sources 182 includes a first group of light sources having a first color and which are controlled by a first control signal indicative of a first on/off frequency provided by the processor 186, and a second group of light sources having a second color and which are controlled by a second control signal indicative of a second different on/off frequency provided by the processor 186. In some embodiments, light sources 182 of a same group may emit light having different colors. In another embodiment, only those light sources 182 controlled by the control signal provided the processor 186 are turned on/off at the determined frequency in one period which is long enough, for example, 0.5 second or longer, and in such one period, all the other light sources are maintained off.

Alternatively or optionally, the heat dissipating device 100 includes a speed detector 196, which may include a light source and an optical sensor, for detecting the rotational speed of the plurality of fan blades 138. The speed detector 196 can transmit a signal indicative of the detected rotational speed of the plurality of fan blades 138 to the processor 186 and/or the motor control circuit 178. The processor 186 and/or the motor control circuit 178 can realize more accurate control of the plurality of light sources 182 and the motor 192, based on the detected real time rotational speed provided by the speed detector 196.

Figure 11B:
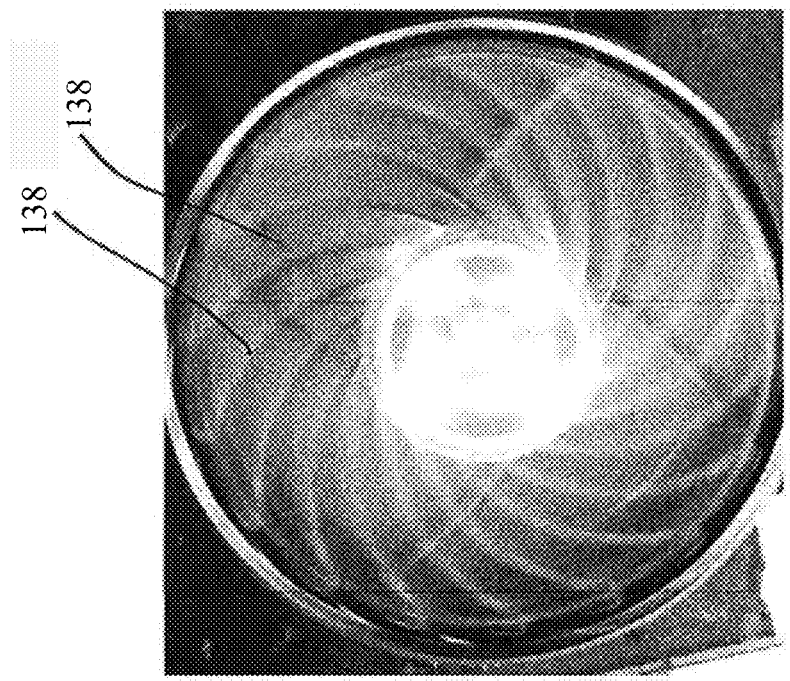
FIGS. 11A-12B are photos respectively illustrating modes of operation of the fan according to embodiments of the present disclosure.
Figure 11A:
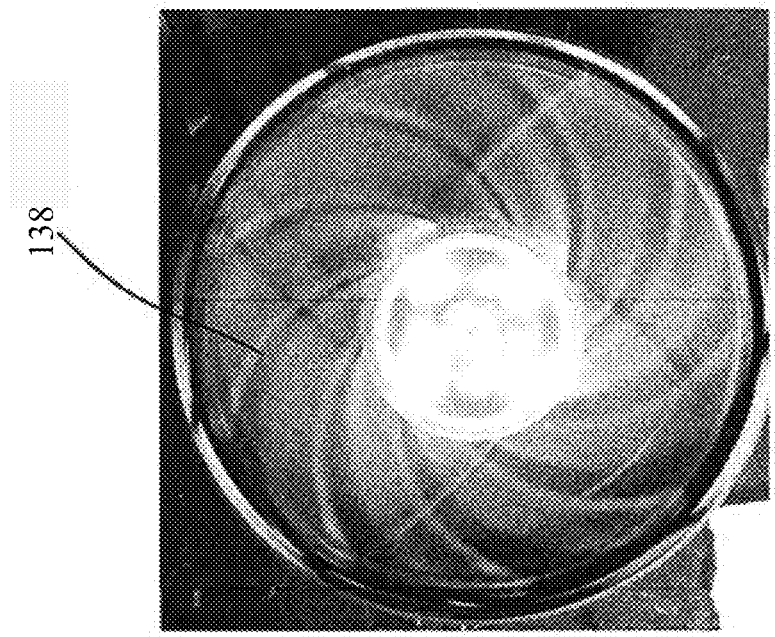

A non-restrictive example of illuminated fan blades 138 is shown in FIG. 11A. In this case, the frequency of the light sources 182 is controlled using Equation (1), in which C is 1, N is 5, R is 1500 rpms. The light sources 182 are thus turned on/off at a frequency f determined to be 125 Hz, and the user can observe a visually static view of 5 blades of the fan even though all the blades rotate at a speed of 1500 rpms.

In this case, the color of the light sources is controller at the determined frequency f such that the light sources 182 emit one color for a time period and the light sources 182 emit a different color during the successive time period. The user can thus observe 5 virtually static blades in two different colors alternatively.

Another non-restrictive example of illuminating blades 138 is shown in FIG. 11B. In this case, N is 5, R is 1470 rpms, similar to the values in the example of FIG. 4A discussed above; however, C is selected to be 2. The on/off frequency f thus is determined to be 250 Hz, two times the on/off frequency used in FIG. 11A.

As shown in FIG. 11B, the user can thus observe a virtually static view of 10 blades, two times the total 5 blades of the fan, even though all 5 blades rotate at a speed of 1500 rpms.

The two modes of operation discussed above can be alternated and the user may periodically observe 5 blades and 10 blades. One of ordinary skill in the art would appreciate that when the light sources 182 shown in FIG. 11B emit light having a different color from the color of the light sources 182 shown in FIG. 4A, the user may periodically observe visually static 5 blades in one color and visually static 10 blades in another different color.

It should be appreciated that in a case in which C is selected to be other natural numbers such as 3, 4, . . . , etc., a visually static view of three times, four times, . . . etc., of the total 5 blades 138 will be observed by the user.

In addition to generate the control signal indicative of the on/off frequency of at least one of the plurality of light sources 182 based on Equation (1), the processor 186 is configured to generate the control signal indicative of the on/off frequency of at least one of the plurality of light sources 182 based on one of the following Equations (2) and (3):

$$f > \frac{R}{60} \times N \times C \quad \text{Equation (2)}$$

$$f < \frac{R}{60} \times N \times C \quad \text{Equation (3)}$$

wherein, f is the on/off frequency of at least one of the plurality of light sources 182, R is the received rotational speed of the motor in rpms, N is the number of the fan blades 138, and C is a constant which can be a natural number. In a certain embodiment, f is determined by the processor 186 to be greater than $R/60 \times N \times C$ but not exceed (100%+a first predetermined percentage)$\times R/60 \times N \times C$ in accordance with Equation (2) and less than $R/60 \times N \times C$ but no less than (100%−a second predetermined percentage)$\times R/60 \times N \times C$ in accordance with Equation (3). The first and second predetermined percentage may be equal to 3% in some embodiments.

Figure 12B:
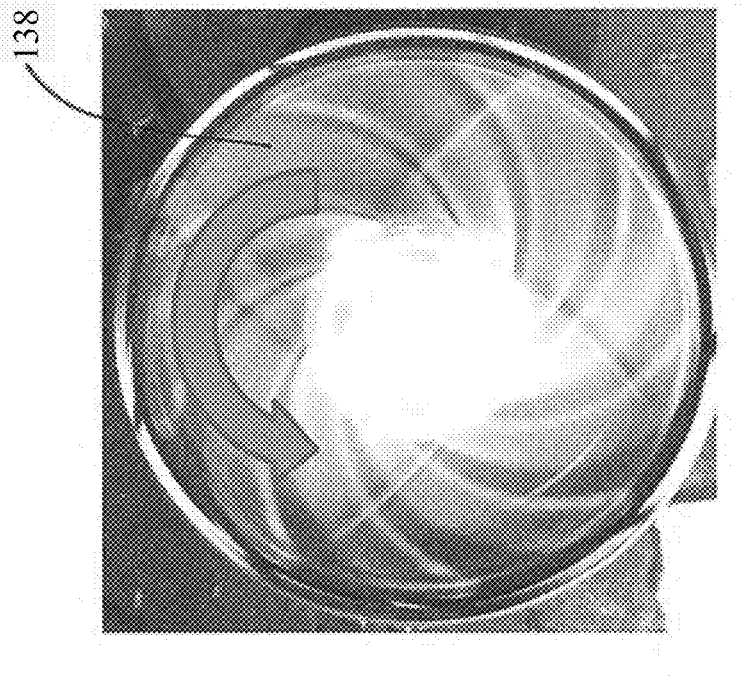
Figure 12A:
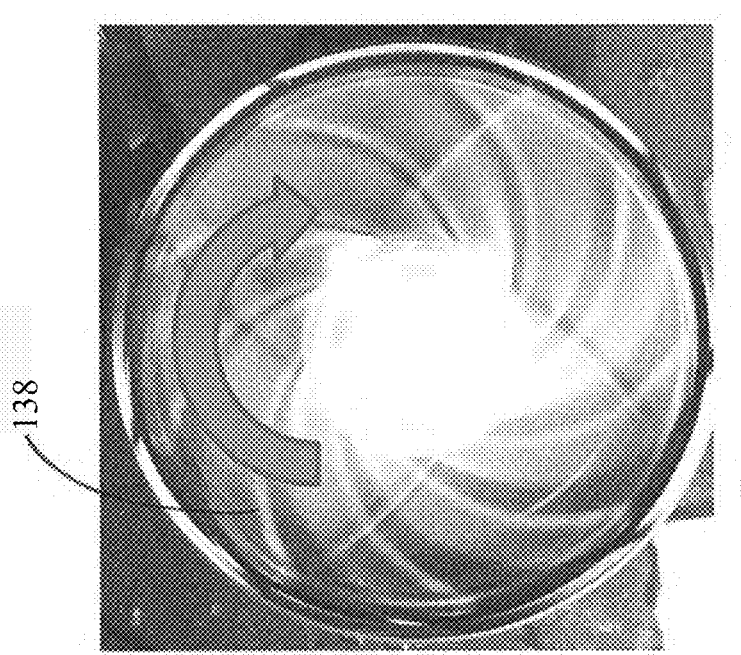

FIG. 12A shows an example based on Equation (2), in which C is 1, N is 5, R is 1500 rpms, and the light sources are turned ON/OFF at a frequency f=128 Hz, slightly greater than 125 Hz (125=$R/60 \times N \times C$), in which the user can observe 5 blades slowly rotating in a clockwise direction even though all the 5 blades rotate at a speed of 1470 rpms.

FIG. 12B shows an example based on Equation (3), in which C is 1, N is 5, R is 1470 rpms, and the light sources are turned on/off at a frequency f=119 Hz, slightly lower than 125 Hz (125=$R/60 \times N \times C$), in which the user can observe 5 blades slowly rotating in an anticlockwise direction even though all the fan blades rotate at a speed of 1500 rpms.

One of ordinary skill in the art would appreciate that two or more of the modes shown in FIGS. 12A-12B can be alternately operated.

Although in the modes shown in FIGS. 11A-12B, the light sources emit light having the same color, in some other embodiments, the light sources having different colors may be activated by control of the processor 186 upon receiving the user's selections or based on a predetermined order. Also, by controlling the color of the light from the light sources and the ON/OFF frequency of the light sources, the heat dissipating device 100 can emit colored light that 'flashes' at the ON/OFF frequency and/or can emit a multi colored light (e.g., colors of the rainbow).

According to some embodiments, in a case in which the plurality of light sources 182 can include the red, green, and blue color light sources 191, 193, and 195, upon receiving, the user's selections indicating that two or more modes corresponding to those shown in FIGS. 11A-12B are to be simultaneously provided by the rotor portion, from at least one of an input or a receiver (or in a memory coupled to the processor 186, discussed below) which will be described later, during a same time period, the processor 186 turns on/off a group of light sources emitting light having one color selected from red, green, and blue colors at one frequency satisfying Equation (1), turns on/off another group of light sources emitting light having another color selected from red, green, and blue colors at another frequency satisfying Equation (2), and turns on/off a third group of light sources emitting light having a third color selected from red, green, and blue colors at a third frequency satisfying Equation (3). In this case, when the user views the fan, the user can simultaneously observe three modes corresponding to those shown in FIGS. 11A, 12A and 12B. For instance, in a case in which N is 5 and R is 1500 rpms, the one color is red and the one frequency is 125 Hz, the another color is green and the another frequency is 128 Hz, and the third color is blue and the third frequency is 119 Hz, the user can simultaneously observe 5 static red fan blades, 5 green blades slowly rotating in an clockwise direction, 5 blue blades slowly rotating in an anticlockwise direction while the blades are rotating at 1500 rpms in real time.

On the other hand, according to some other embodiments, during a same time period, the processor 186 turns on/off the plurality of light sources 182 emitting light having colors selected from red, green, and blue at different frequencies satisfying one of Equation (2) and Equation (3). In this case, the user can simultaneously observe three modes corresponding to that shown in either FIG. 12A or FIG. 12B but at different observable rotational speeds. For instance, in a case in which N is 5 and R is 1500 rpms, the light sources emitting red light are controlled to be turned on/off at a frequency of 112 Hz, the light sources emitting green light are controlled to be turned on/off at a frequency of 114 Hz, the light sources emitting blue light are controlled to be turned on/off at a frequency of 116 Hz, the user can simultaneously observe 5 red, green, and blue fan blades slowly rotating in an anticlockwise direction at different observable rotational speeds while the blades are rotating at 1500 rpms in real time. In this case, the observable rotational speed of the red blades is the fastest one and the observable rotational speed of the blue blades is the slowest one of the three observable rotational speeds.

In some embodiments, in a case the plurality of light sources 182 include light sources emitting light having different colors, the plurality of blades 138 can display additional colors by color mixing. For example, the light sources emitting red and green light are synchronously turned on/off according to one of the aforementioned modes, the user can observe a mode in brown rather than a mode in red or a mode in green. For another example, the light sources emitting red and blue light are synchronously turned on/off according to one of the aforementioned modes, the user can observe a mode in purple rather than a mode in red or a mode in blue.

In various embodiments disclosed herein, the processor 186 shown in FIG. 10 may be coupled to a memory (or other non-transitory machine readable recording medium) (not shown) storing computer-executable instructions, which when executed, cause the processor 186 to perform the functions described above. These include functions described to receive the signal indicative of the rotational speed of the motor 192 from the motor control circuit 178, to convert the rotational speed of the motor 192 between different units of measurement, if required, to determine the on/off frequency of at least one of the plurality of light sources 182 based on Equations (1), (2), and (3), and to transmit the signal indicative of the determined on/off frequency to the at least one of the plurality of light sources 182. The memory (not shown in the drawings) accessible to the processor 186, may store the number of fan blades 138 and a default (or predetermined) value of C (which may be changed, if desired).

Figure 13:
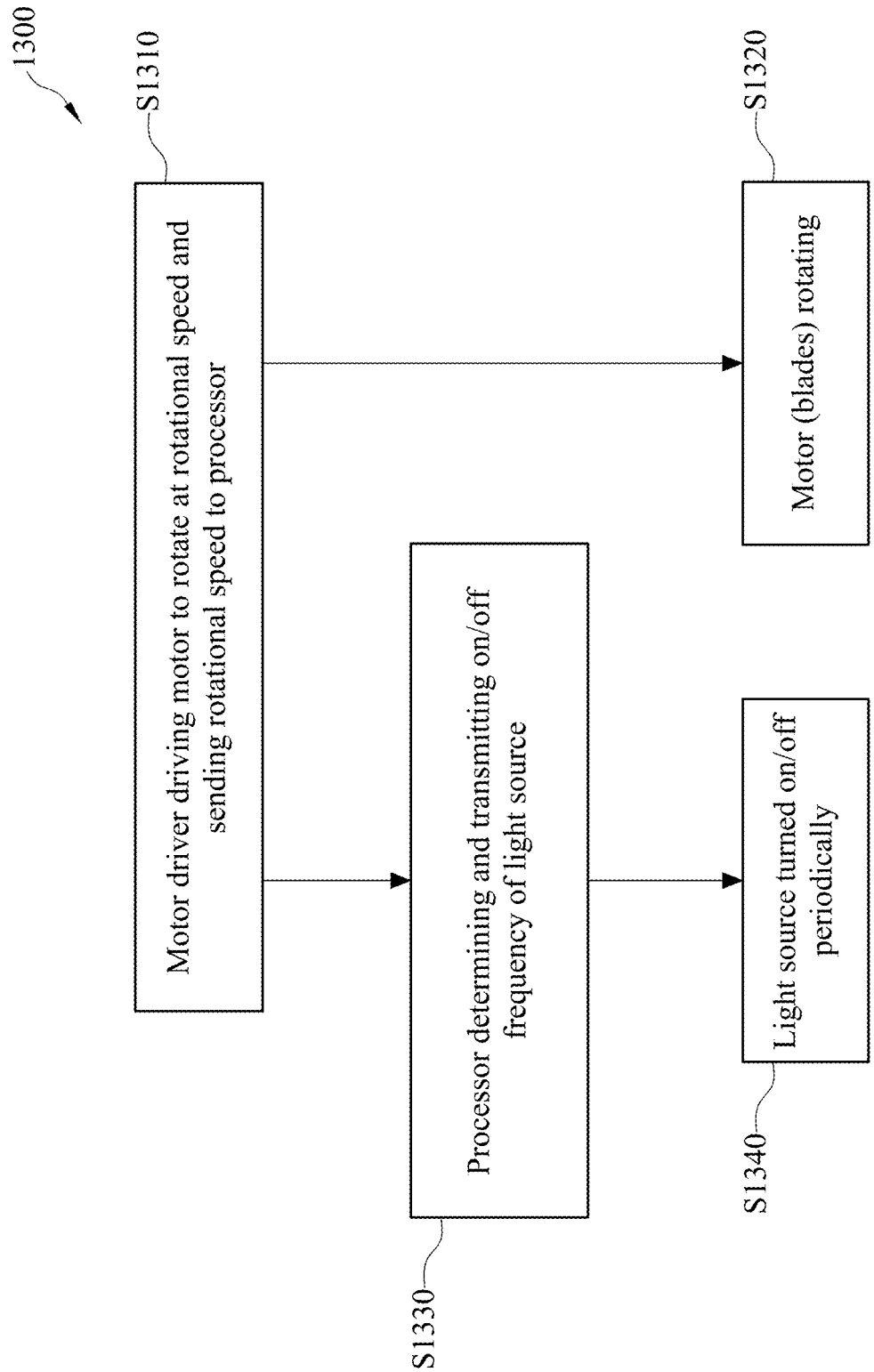
FIG. 13 shows flowchart of a method of controlling the heat dissipating device of FIG. 1 using the circuit illustrated in FIG. 10

FIG. 13 shows flowchart of a method 1300 of controlling the heat dissipating device using the circuit illustrated in FIG. 10. Referring to FIGS. 10 and 13, the motor control circuit 178 drives the motor 192 at a rotational speed and sends a signal indicative of the rotational speed of the motor 192 to the processor 186 (S1310).

The motor 192 rotates at the rotational speed determined by the motor control circuit 178 (S1320). In this case, the plurality of fan blades 138 thus rotate at the same rotational speed.

Based on the received rotational speed from the motor control circuit 178, the process determines, for example, based on Equation (1), Equation (2), or Equation (3), an on/off frequency of the at least one of the plurality of light sources 182, and transmits a control signal indicative of the determined frequency to the at least one of the plurality of light sources 182 (S1330).

The at least one of the plurality of light sources 182, to which the control signal indicative of the determined frequency is configured to be applied, is turned on/off at the determined frequency in response to a control by the control signal indicative of the determined frequency (S1340).

One of ordinary skill in the art would appreciate that although not shown in FIG. 13, additional steps similar to S1330 and S1340 may be periodically performed before or after steps S1330 and S1340 so as to implement various modes including, but not limited to, those shown in FIGS. 11A-12B with or without color changes. These features have been discussed with reference to FIG. 10 and will be omitted here to avoid redundancy.

Figure 14:
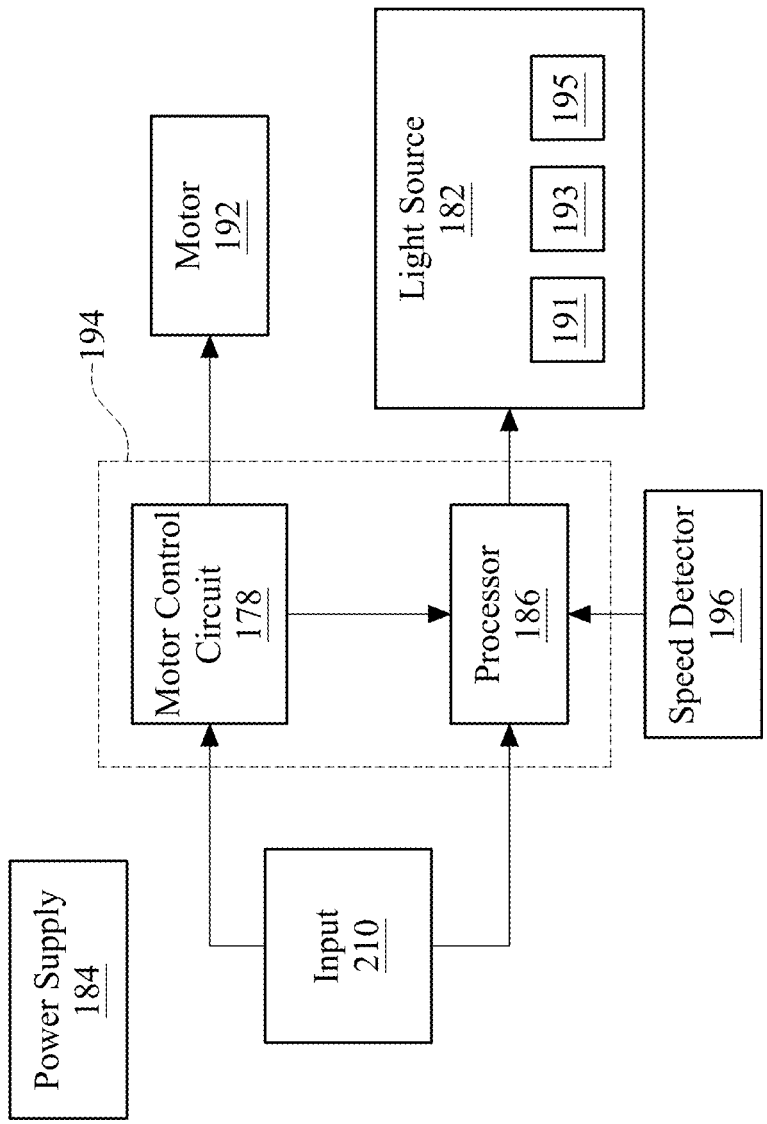
FIG. 14 shows a schematic circuit of the heat dissipating device, according to embodiments disclosed.

FIG. 14 shows a schematic circuit 1400 of the heat dissipating device 100, according to embodiments disclosed. The circuit 1400 may be similar in some respects to the circuit 1000 of FIG. 10 and, therefore, may be best understood with reference thereto, where like numerals represent like element not described again.

The circuit 1400 includes an input 210. The input 210 may be a user interface including one or more of a touchscreen, a touchpad, a keyboard, a button, and a knob, allowing the user to select a mode of operation, for example, by selecting a value of C indicating the number of fan blades to be visually displayed and selecting a color of the light sources which are associated with the selected value of C. Optionally, the input 210 may receive another input from the user to select a rotational speed of the motor 192.

In some embodiments, the input 210 is configured to allow the user to input various options to enable the motor to alternately work in various modes shown in FIGS. 4A-5B with or without color changes.

The motor control circuit 178 receives the input from the input 210 to control the rotational speed of the motor 192.

The processor 186 receives, from the input 210, an input indicating the mode of operation including a value of C indicating the number of fan blades to be visually displayed and the color of the light sources which will be turned on/off according to the frequency determined based at least on the value of C. The processor 186 may receive a signal indicative of the rotational speed of the motor 192 from the motor control circuit 178, or alternatively, may receive a signal indicative of the rotational speed of the motor 192 selected by the user directly from the input 210. Based on the received signals, the processor 186 determines the on/off frequency of the selected light sources 182 and transmits the determined on/off frequency to the respective light sources 182.

One of ordinary skill in the art would appreciate that the heat dissipating device 100 can operate in a mode with a default value of C set by the manufacturer or the user or operate in the last mode before the fan is turned off, in the event no input is provided to the input 210.

Figure 15:
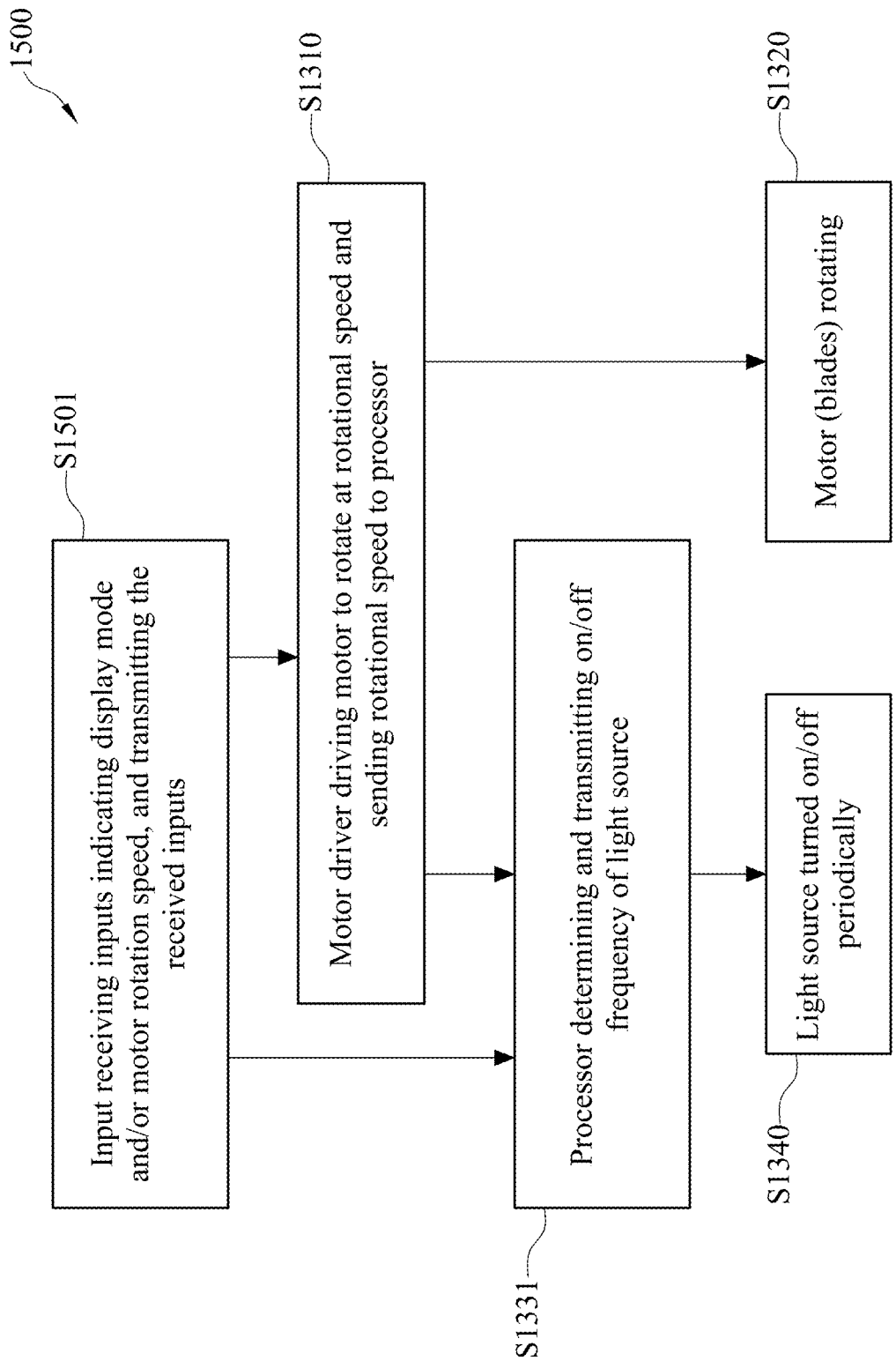
FIG. 15 shows flowchart of a method of controlling the heat dissipating device of FIG. 1 having the circuit of FIG. 14.

FIG. 15 shows flowchart of a method 1500 of controlling the heat dissipating device 100 having the circuit 1400. As shown in FIG. 15, the input 210 receives an input from the user indicating a mode of operation of the fan and transmits signals indicating the user input to the processor 186 and the motor control circuit 178 (S1501). Parameters representing the mode of operation include, but are not limited to, at least one of a value of C, a selection of visually static view of fan blades and visually slowly rotating view of fan blades (anticlockwise or clockwise), and a color of the light sources. Optionally, the input 210 may receive another input from the user to select a rotational speed of the motor 192 (S301).

The motor control circuit 178 receives a signal indicating the rotational speed of the motor 192 set by the user from the input 210 and drives the motor 192 accordingly. The motor control circuit 178 may transmit a signal indicating the rotational speed of the motor 192 to the processor 186.

The processor 186 receives from the input 210 a signal indicating the mode of operation of the fan set by the user. The processor 186 receives a signal indicating the rotational speed from one of the input 210 and the motor control circuit 178. Based on the received signals, the processor 186 determines the on/off frequency based on one of Equations (1), (2), and (3), and transmits the determined on/off frequency to the corresponding light sources (S1331).

Descriptions of steps S1320 and S1330 may be referred to the descriptions with reference to FIG. 13 and therefore will be omitted for the sake of brevity.

Figure 16:
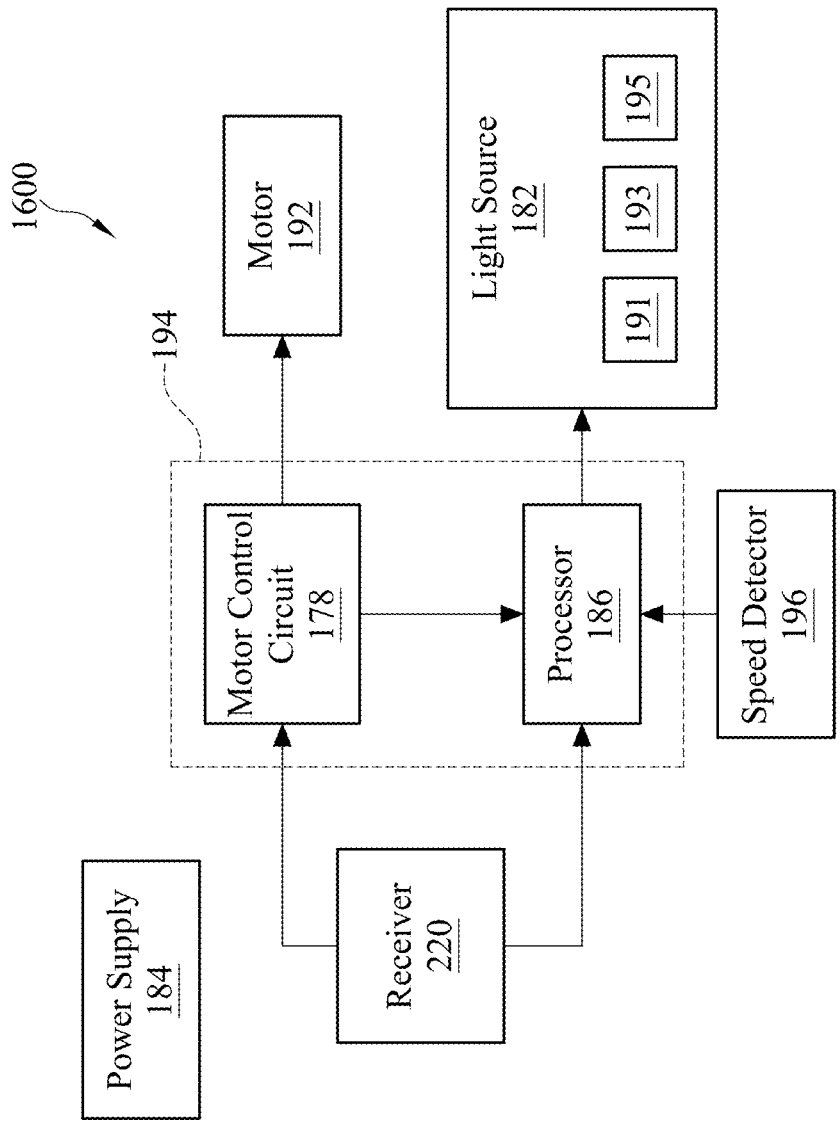
FIG. 16 shows a schematic circuit of the heat dissipating device of FIG. 1, according to embodiments of the present disclosure.

FIG. 16 shows a schematic circuit 1600 of the heat dissipating device 100, according to embodiments of the present disclosure. The circuit 1600 may be similar in some respects to the circuit 1400 of FIG. 14 and, therefore, may be best understood with reference thereto, where like numerals represent like element not described again.

The circuit 1600 includes a receiver 220, which may be an infrared receiver or a wireless receiver configured to have a communication chip for receiving a BLUETOOTH signal, a WI-FI signal, and/or a cellular signal, receives a wireless signal indicating a remote input made by the user through, for example, by a remote controller or a smart portable device such as a smart phone. The remote input by the user may be referred to the user input discusses with reference to FIG. 14 and will not be repeated here.

The motor control circuit 178 and the processor 186 are configured to receive the corresponding signals from the receiver 220, similar to a case in which the motor control circuit 178 110 and the processor 186 are configured to receive the corresponding signals from the input 210 as shown in FIG. 13.

Figure 17:
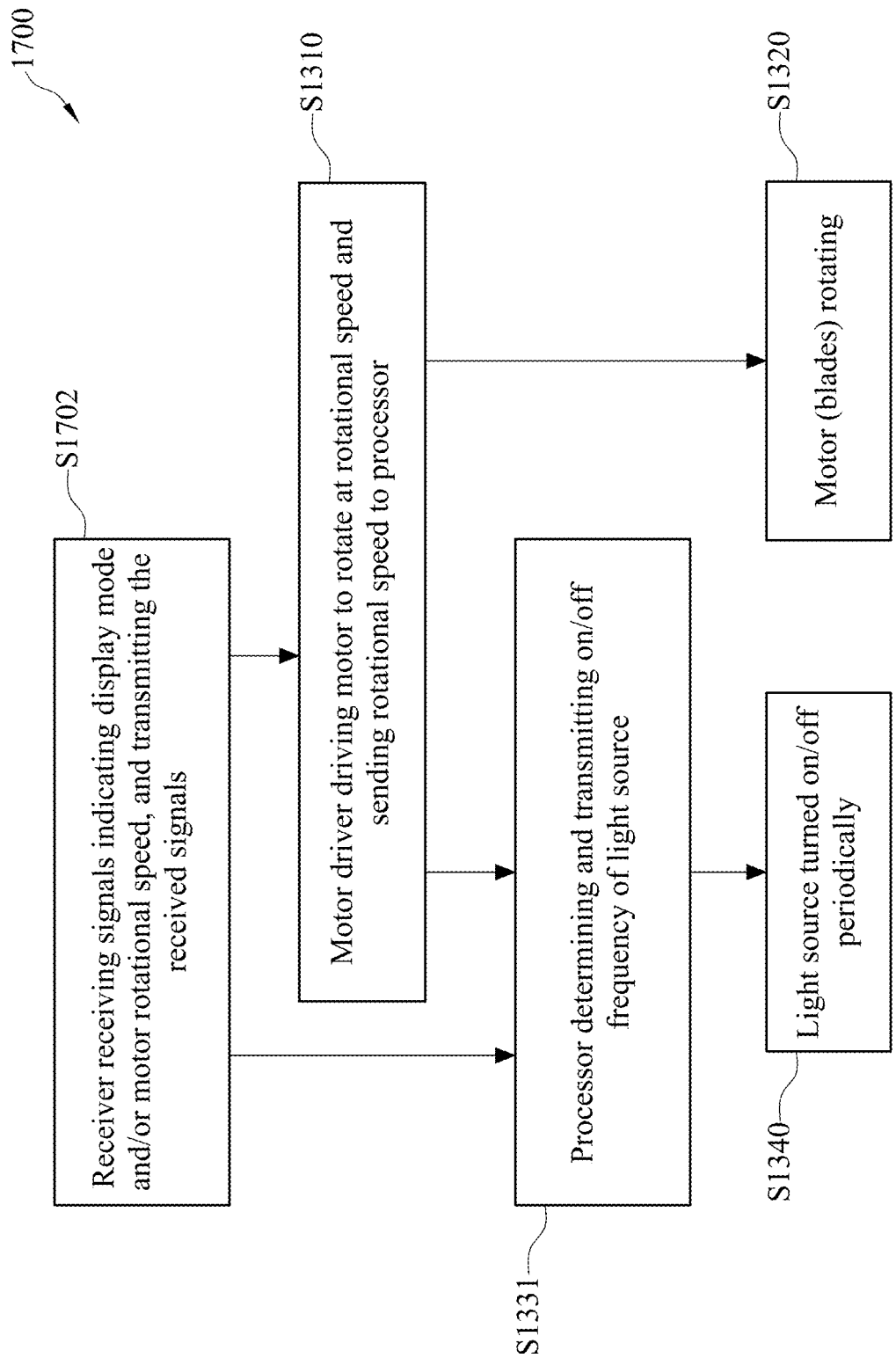
FIG. 17 shows a flowchart of a method of controlling the heat dissipating device of FIG. 1 having the circuit of FIG. 16.

FIG. 17 shows a flowchart of a method 1700 of controlling the heat dissipating device 100 having the circuit 1600 shown in FIG. 16. The method 1700 may be similar in some respects to the method 1500 of FIG. 15 and, therefore, may be best understood with reference thereto, where like numerals represent like element not described again.

The method 1700 is the same as that shown in FIG. 15, except that the receiver 220, rather than the input 210, receives signals indicating the user's selection and transmits the received signals to the processor 186 and the motor control circuit 178 (see S1702).

Figure 18:
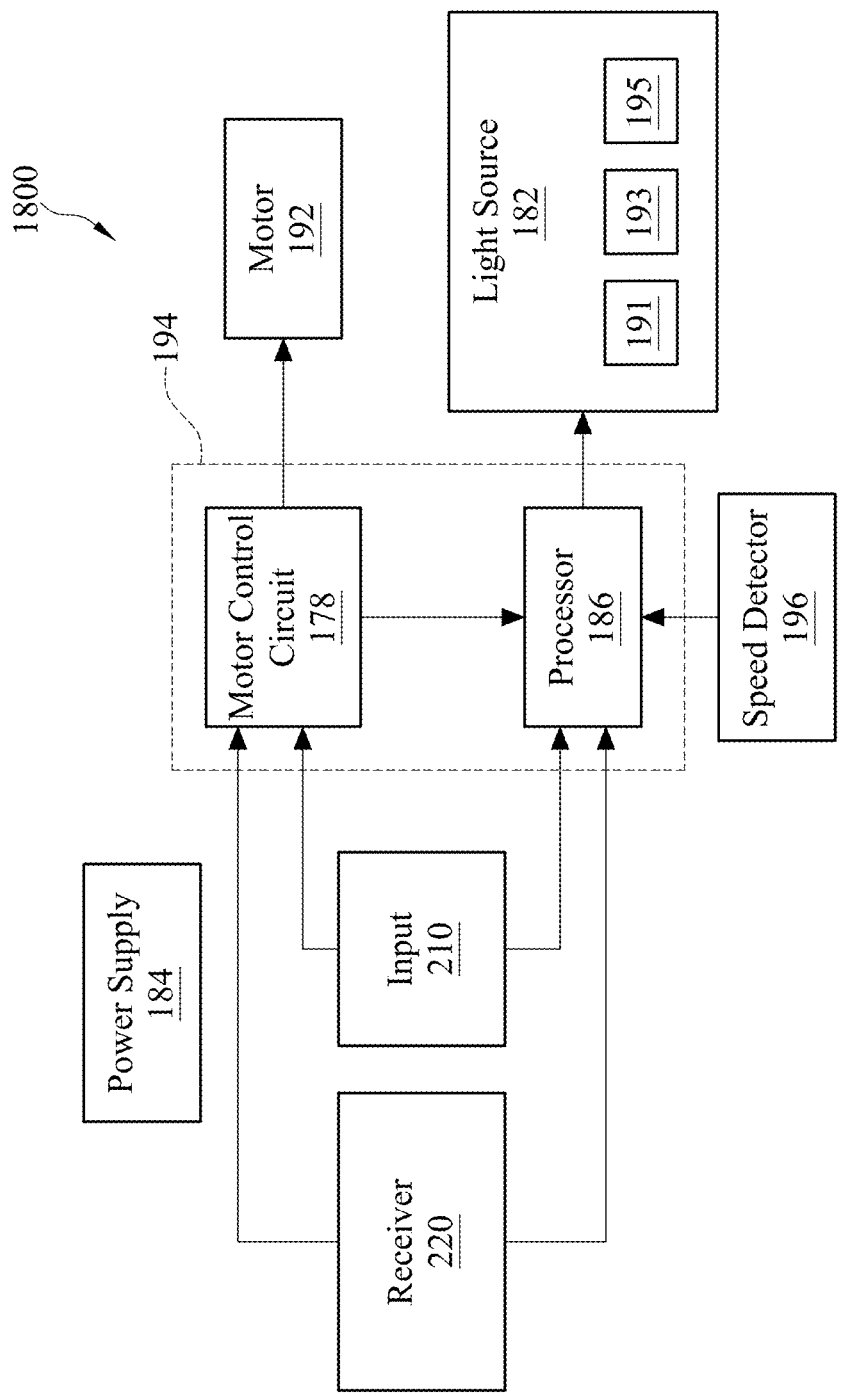
FIG. 18 shows a schematic circuit of the heat dissipating device of FIG. 1, according to embodiments of the present disclosure.

FIG. 18 shows a schematic circuit 1800 of the heat dissipating device 100, according to embodiments of the present disclosure. The circuit 1800 may be similar in some respects to the circuit 1400 and 1600 of FIGS. 14 and 16 and, therefore, may be best understood with reference thereto, where like numerals represent like element not described again.

In circuit 1800 both the input 210 and the receiver 220 are implemented in the heat dissipating device 100

Figure 19:
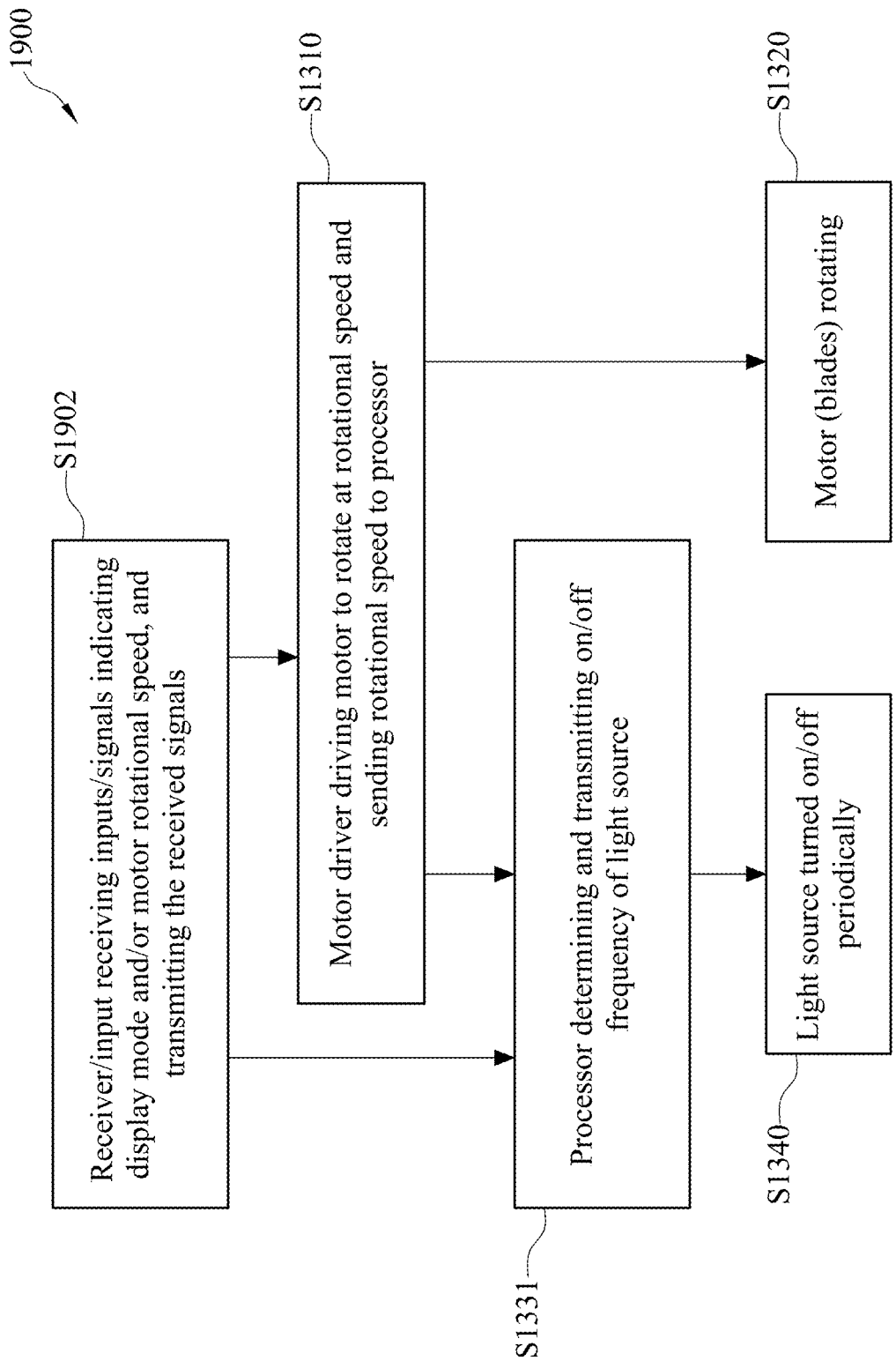
FIG. 19 shows a flow chart of a method of controlling the heat dissipating device of FIG. 1 having the circuit of FIG. 18.

FIG. 19 shows a flow chart of a method 1900 of controlling the heat dissipating device 100 having the circuit 1800 of FIG. 18.

The method 1900 is the same as the methods 1500 and 1700 shown in FIG. 15 and FIG. 17, except that the receiver 220 and/or the input 210 receive signals and/or inputs indicating user's selection and transmit corresponding signals to the processor 186 and the motor control circuit 178 (S1903).

Figure 20:
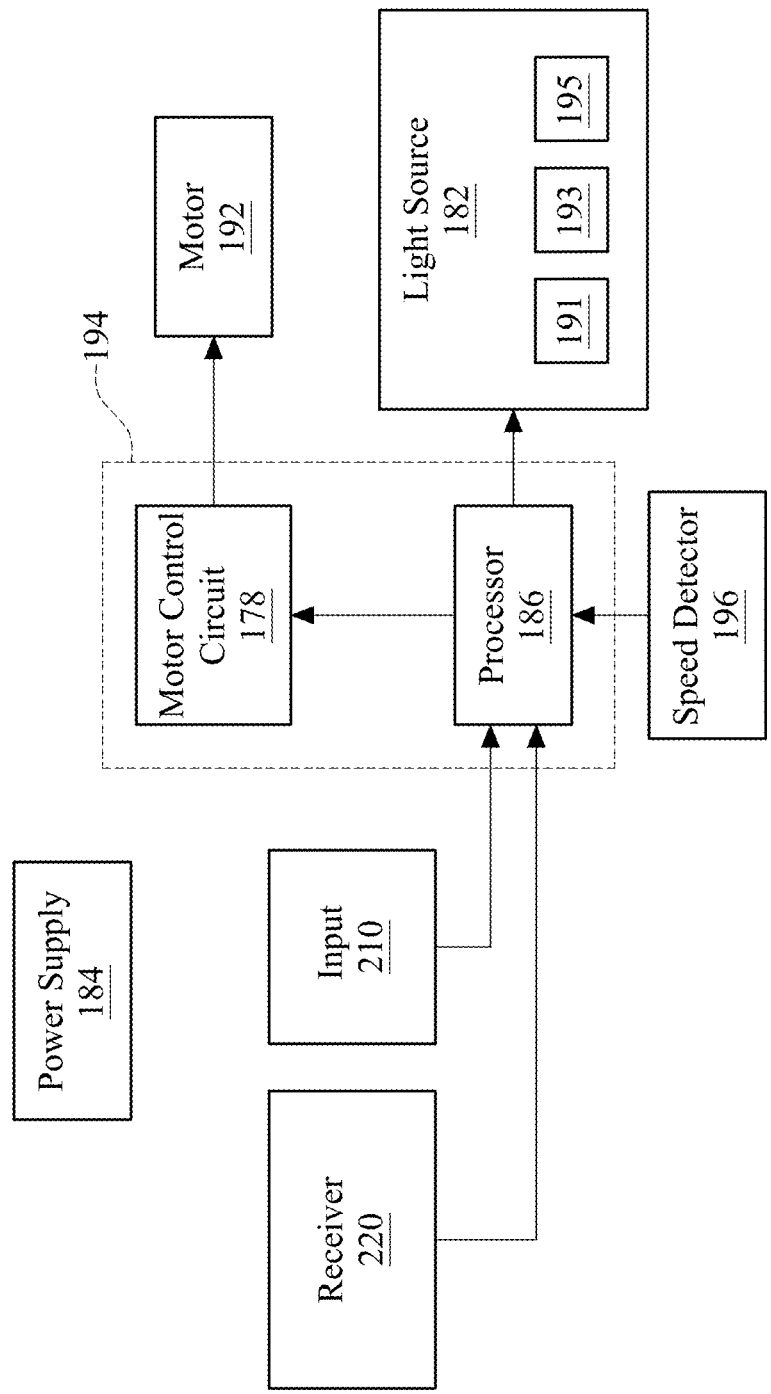
FIG. 20 shows a modified circuit of a heat dissipating device of FIG. 1 according to embodiments of the present disclosure, based on the circuit shown in FIG. 18.

FIG. 20 shows a modified circuit 2000 of a heat dissipating device 100 according to embodiments of the present disclosure, based on the circuit 1800 of the heat dissipating device 100 shown in FIG. 18. The circuit 2000 may be similar in some respects to the circuit 1800 of FIG. 18 and, therefore, may be best understood with reference thereto, where like numerals represent like element not described again.

Referring to FIG. 20, at least one of the receiver 220 and the input 210 transmits a signal indicating a rotational speed of the motor 192 to the processor 1186, rather than to the motor control circuit 178 as shown in FIG. 18. In this case, the processor 186 transmits the received signal indicating the rotational speed of the motor 192 to the motor control circuit 178 to enable the motor control circuit 178 to drive the motor 192 to rotate according to the received rotational speed. In some embodiments, one or both of the receiver 220 and the input 210 are omitted.

Figure 21:
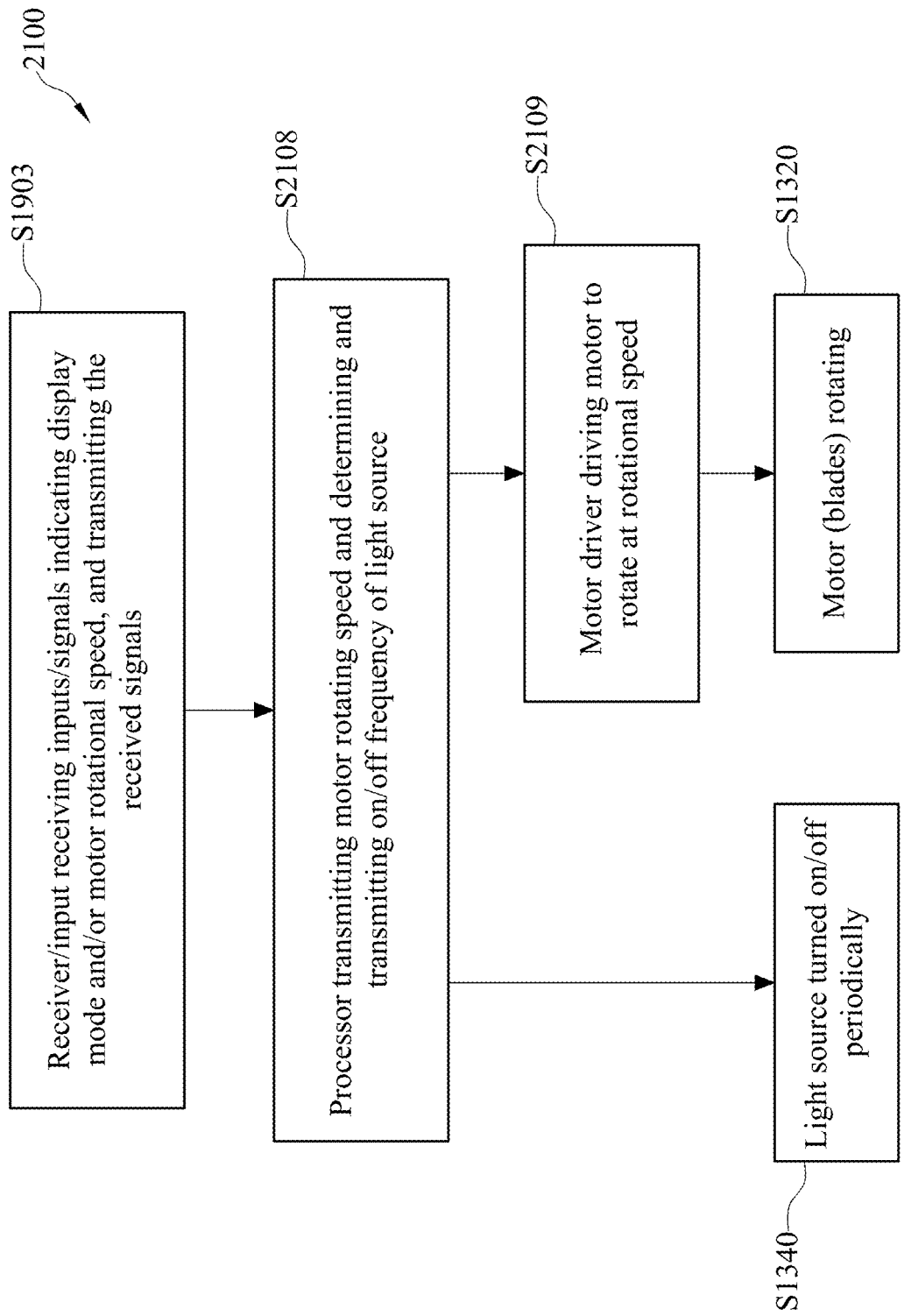
FIG. 21 shows flowchart of a method of controlling the heat dissipating device of FIG. 1 having the circuit of FIG. 20

FIG. 21 shows flowchart of a method 2100 of controlling the heat dissipating device 100 having the circuit 2000 shown in FIG. 20.

The method 2100 shown in FIG. 21 is substantially the same as that shown in FIG. 19, except that the processor 186 receives (S1903) a signal indicating a rotational speed of the motor 192 and transmits (S2108) the received signal to the motor control circuit 178 for driving (S2109) the motor 192.

Figure 22:
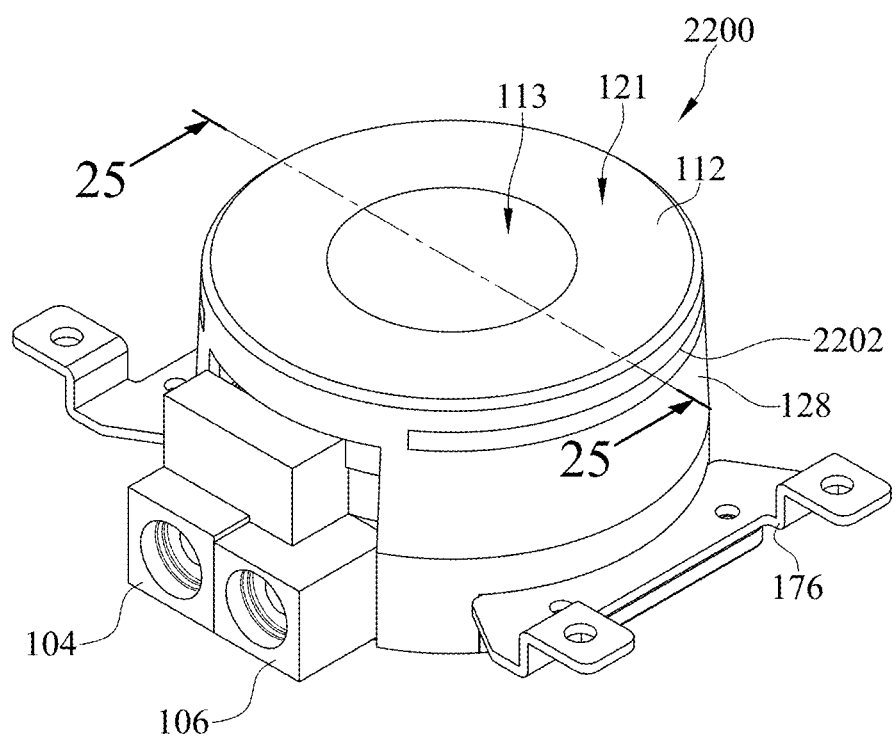
FIG. 22 illustrates an exemplary heat dissipating device, according to embodiments disclosed.

FIG. 22 illustrates a heat dissipating device 2200, according to embodiments disclosed. The heat dissipating device 2200 is similar in some respects to the heat dissipating device 100 of FIG. 1 and, therefore, is best understood with reference thereto, where like numerals represent like elements not described again. As illustrated, the cover 112 of the heat dissipating device 2200 includes two elongated slots 2202 located diametrically opposite each other adjacent the top surface 121. However, in other embodiments, more than two slots 2202 are included in the cover 112. The slots 202 are located at regular intervals or at random intervals in the cover 112.

Figure 23:
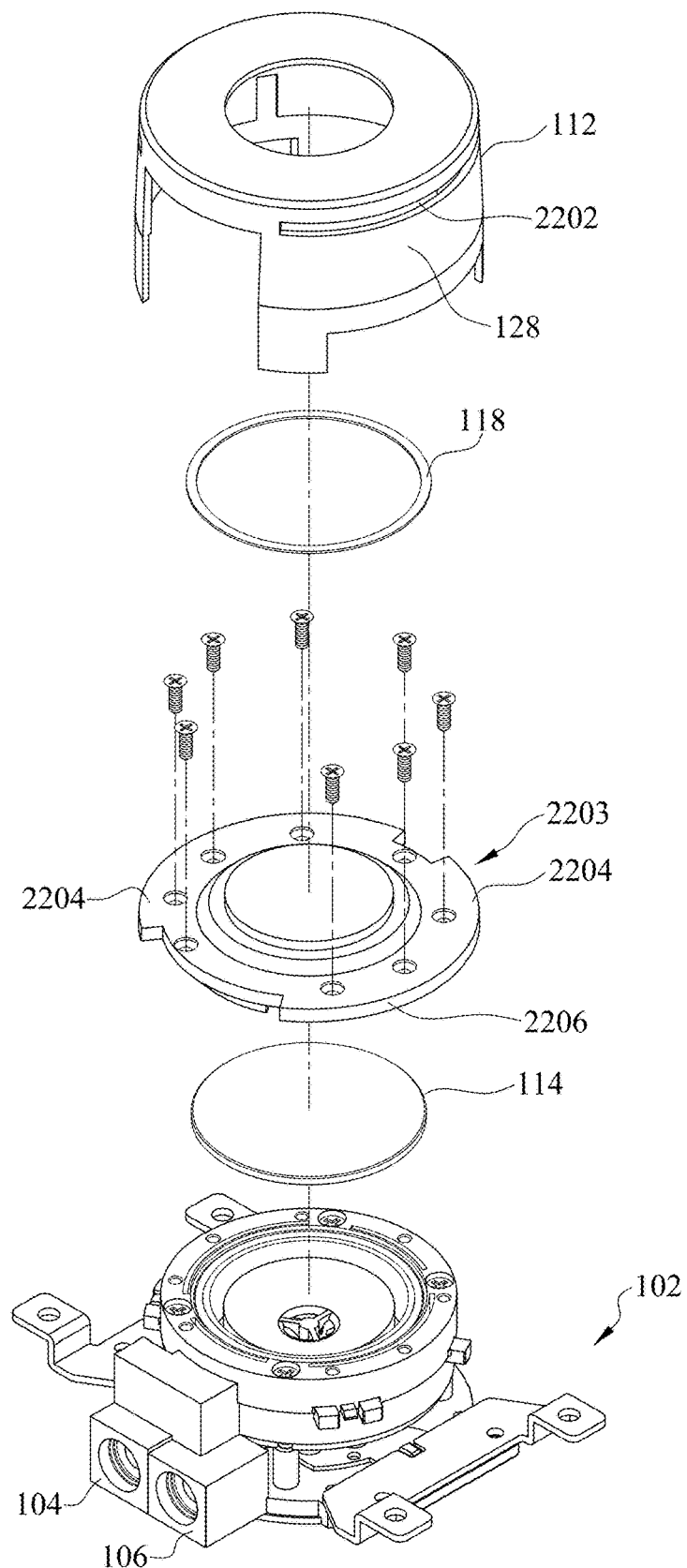
FIGS. 23 and 24 illustrate exploded views of the heat dissipating device of FIG. 22, according to embodiments disclosed.
Figure 24:
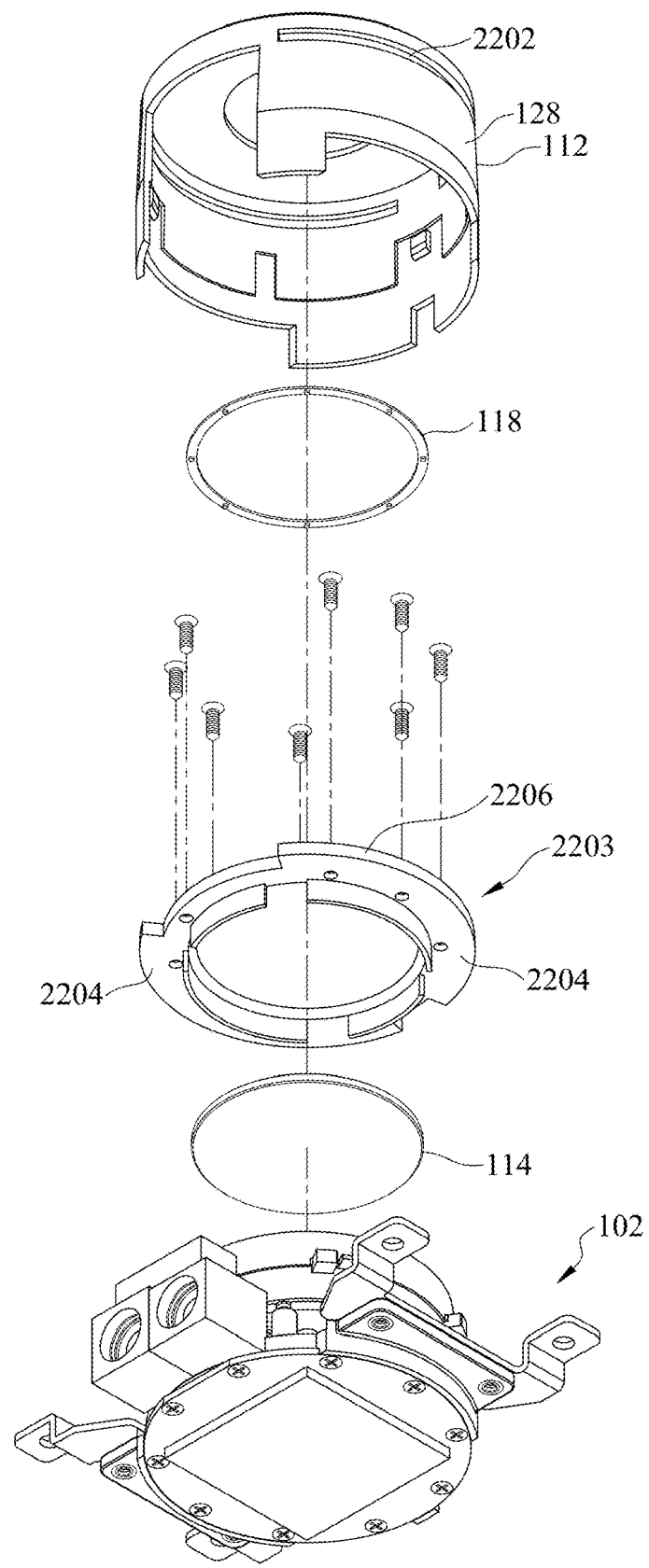

FIGS. 23 and 24 illustrate exploded views of the heat dissipating device 2200, according to embodiments disclosed. The heat dissipating device 2200 includes a light guide 2203 having curved protrusions 2204 extending radially outward from the outer circumferential end of the light guide 2203. Each curved protrusion 2204 is sized to be received in the corresponding slot 2202. When assembled, the end surface 2206 of the curved protrusions 2204 is flush with the outer circumferential surface 128 of the cover 112. During operation, light from the light emitting devices is also emitted from the sides of the outer cover 112 due to the light guide 203.

Figure 25:
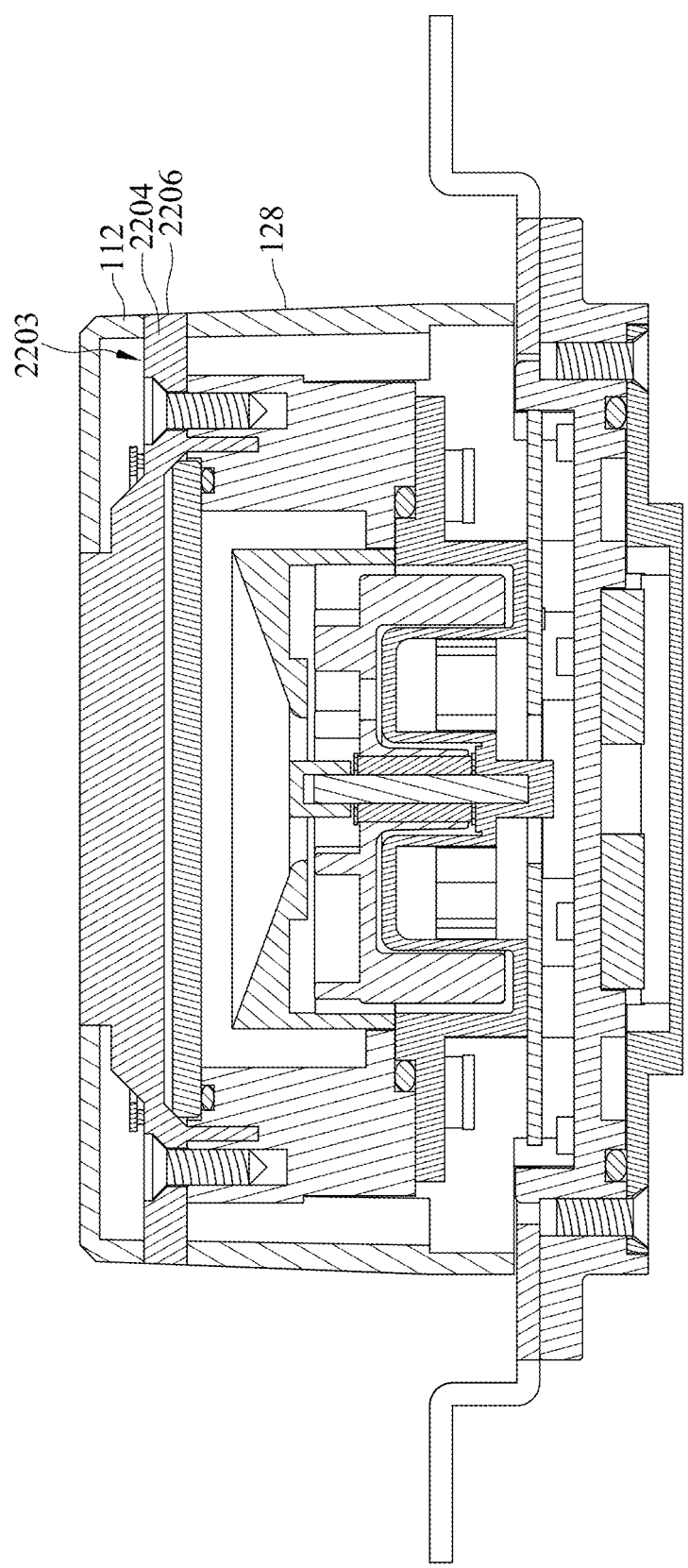
FIG. 25 illustrates a cross-sectional view of the heat dissipating device of FIG. 22 taken along the line 25-25.

FIG. 25 illustrates a cross-sectional view of the heat dissipating device 2200 of FIG. 9 taken along the line 25-25. The cross-sectional view illustrates the arrangement of the different components in the assembled state of the heat dissipating device 2200. As illustrated, the end surface 2206 of the curved protrusions 2204 is flush with the outer circumferential surface 128 of the cover 112.

Figure 26:
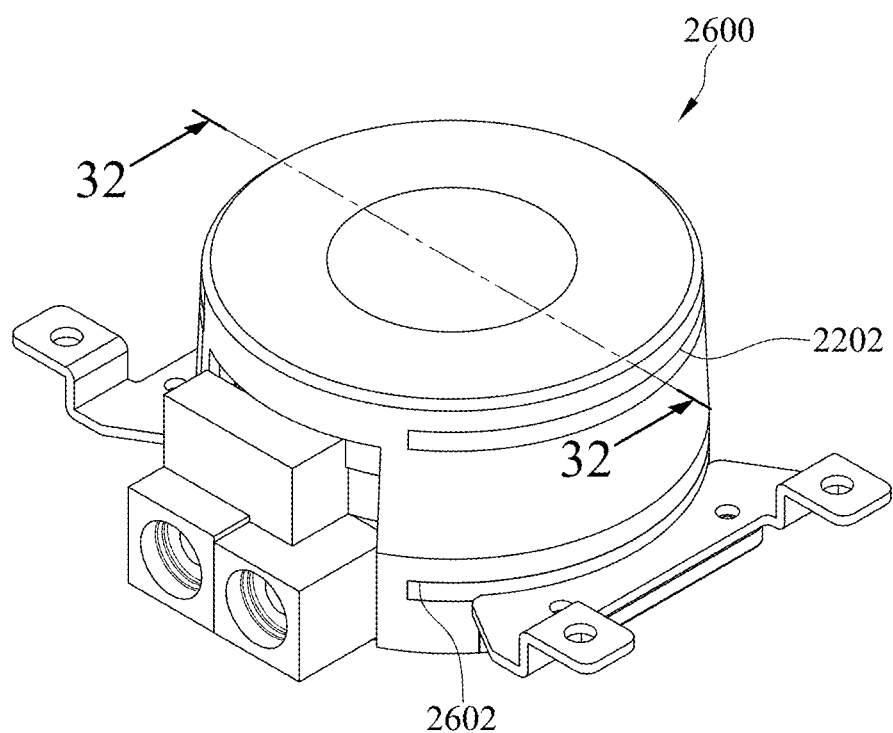
FIG. 26 illustrates an exemplary heat dissipating device, according to embodiments disclosed.

FIG. 26 illustrates a heat dissipating device 2600, according to embodiments disclosed. The heat dissipating device 2600 is similar in some respects to the heat dissipating devices 100 and 2200 of FIGS. 1 and 22, and, therefore, is best understood with reference thereto, where like numerals represent like elements not described again. The heat dissipating device 2600 includes openings 2602 located diametrically opposite each other adjacent a lower end of the cover 112. However, in other embodiments, more than two openings 2602 are included in the cover 112. The openings 2602 are located at regular intervals or at random intervals in the cover 112.

Figure 27:
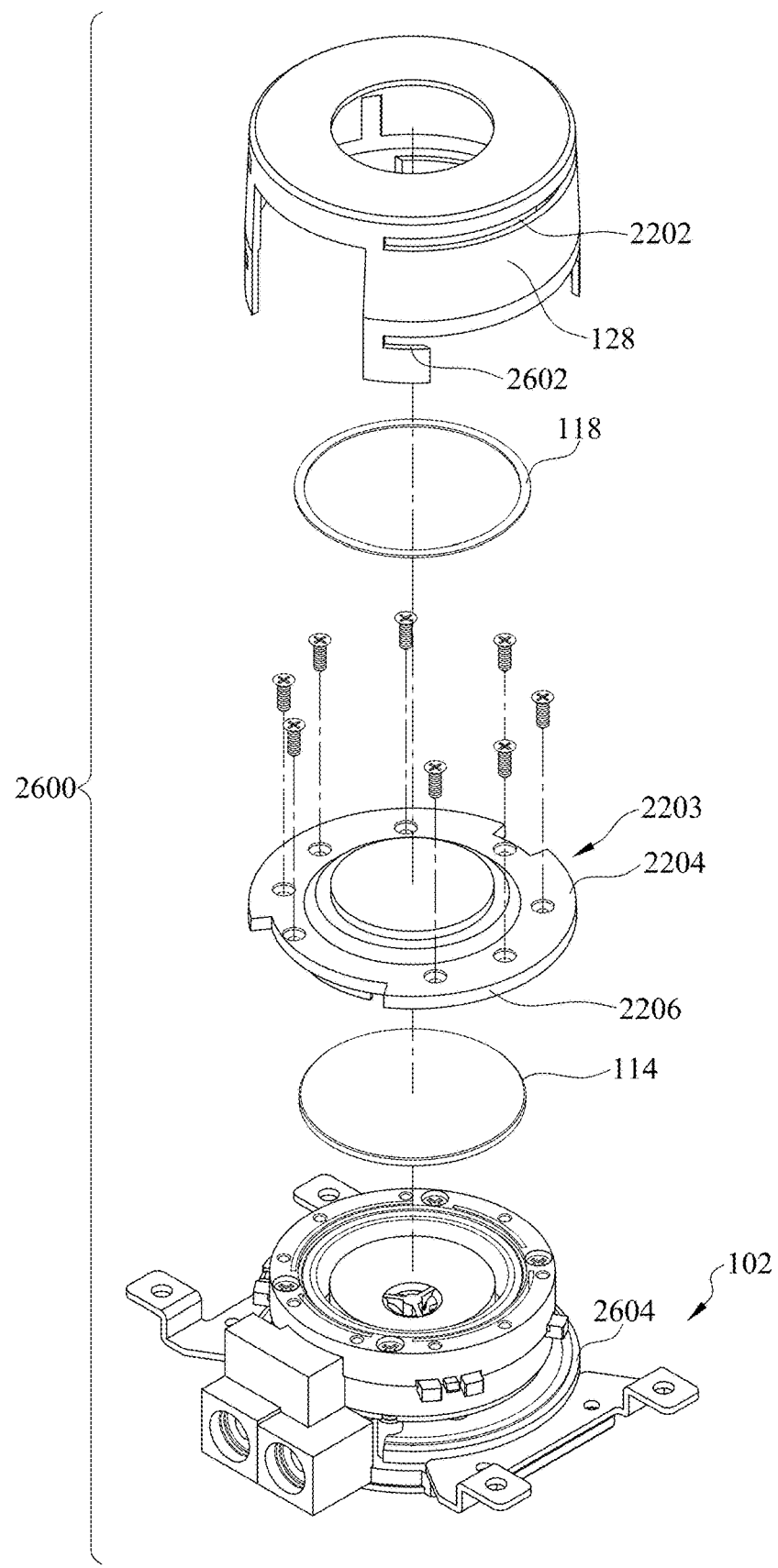
FIGS. 27 and 28 illustrate exploded views of the heat dissipating device of FIG. 26, according to embodiments disclosed.
Figure 28:
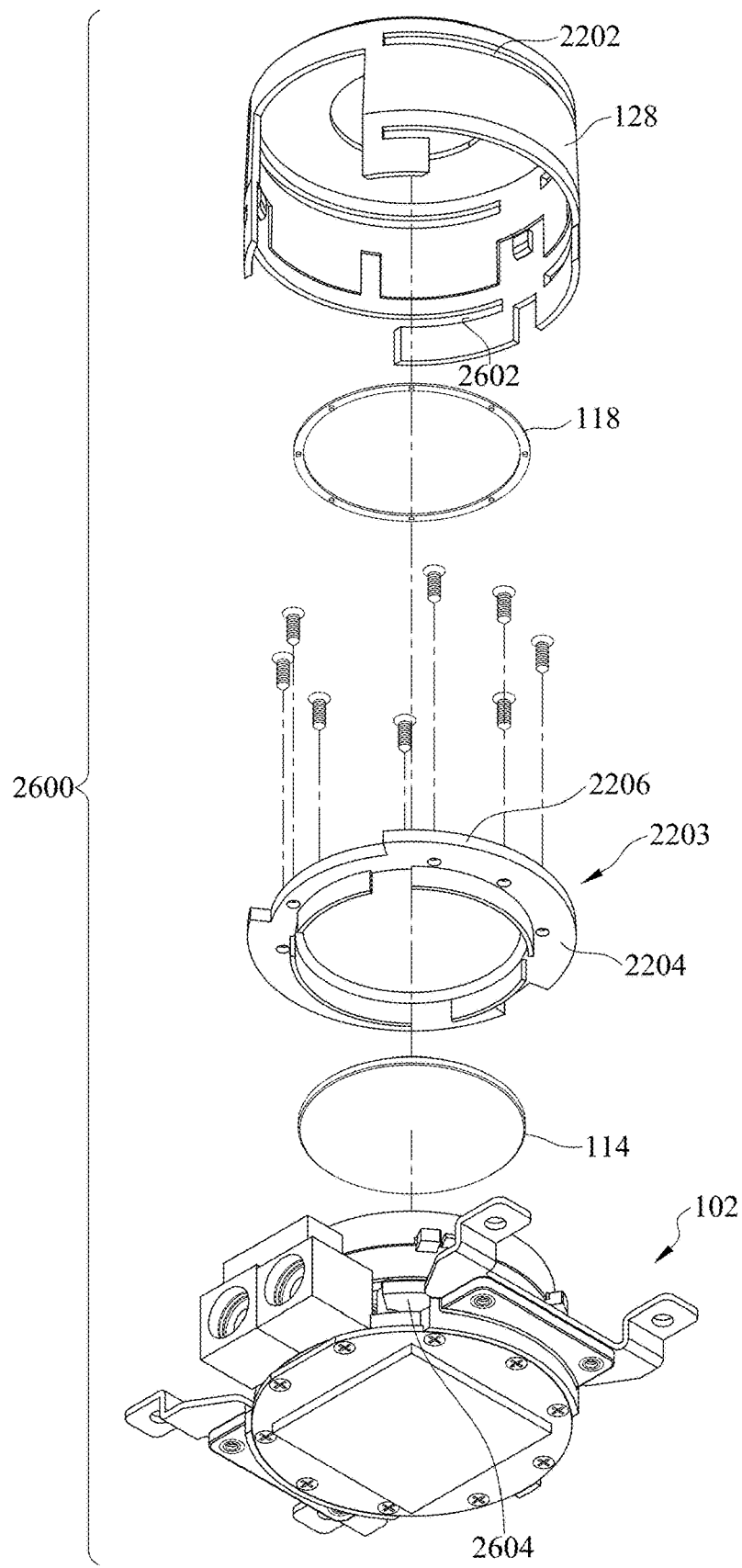

FIGS. 27 and 28 illustrate exploded views of the heat dissipating device 2600, according to embodiments disclosed. The bottom assembly 102 includes a second light guide 2604 that is received in the openings 2602.

Figure 29:
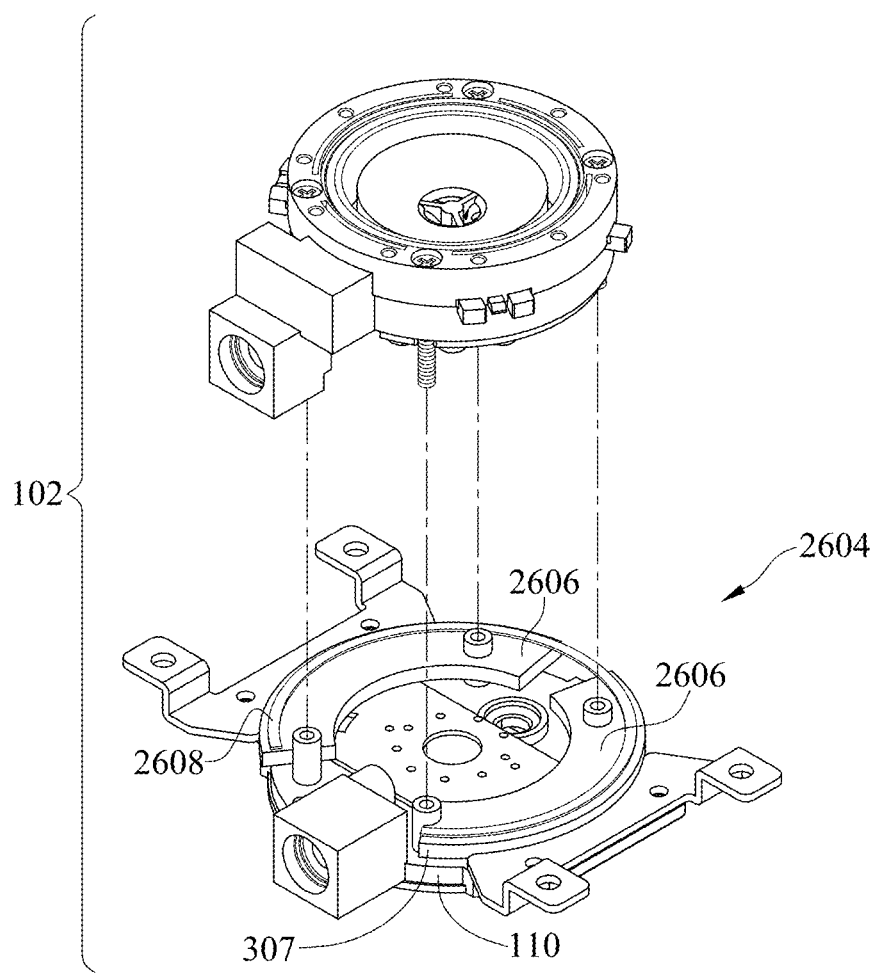
FIG. 29 illustrates an exploded view of the bottom assembly in FIGS. 27 and 28 illustrating the second light guide of FIGS. 27 and 28 in greater detail, according to embodiments disclosed.

FIG. 29 illustrates an exploded view of the bottom assembly 102 illustrating the second light guide 2604 in greater detail, according to embodiments disclosed. The second light guide 2604 is disposed on the heat exchange unit 110 and is made of two parts (or pieces) 2606 that are sized or otherwise configured to be received in the corresponding openings 2602. As illustrated the two parts 2606 are curved. The bottom assembly 102 also includes a second light assembly 2608 arranged on the second light guide 2604. The second light assembly 2608 is C-shaped to accommodate the inlet 104 and outlet 106 of the heat dissipating device 300. The second light assembly 2608 includes a plurality of light emitting devices. The light emitting devices are arranged at regular intervals along the second light assembly 2608. However, in some embodiments, the light emitting devices are arranged at irregular intervals, without departing from the scope of the disclosure.

Figure 30:
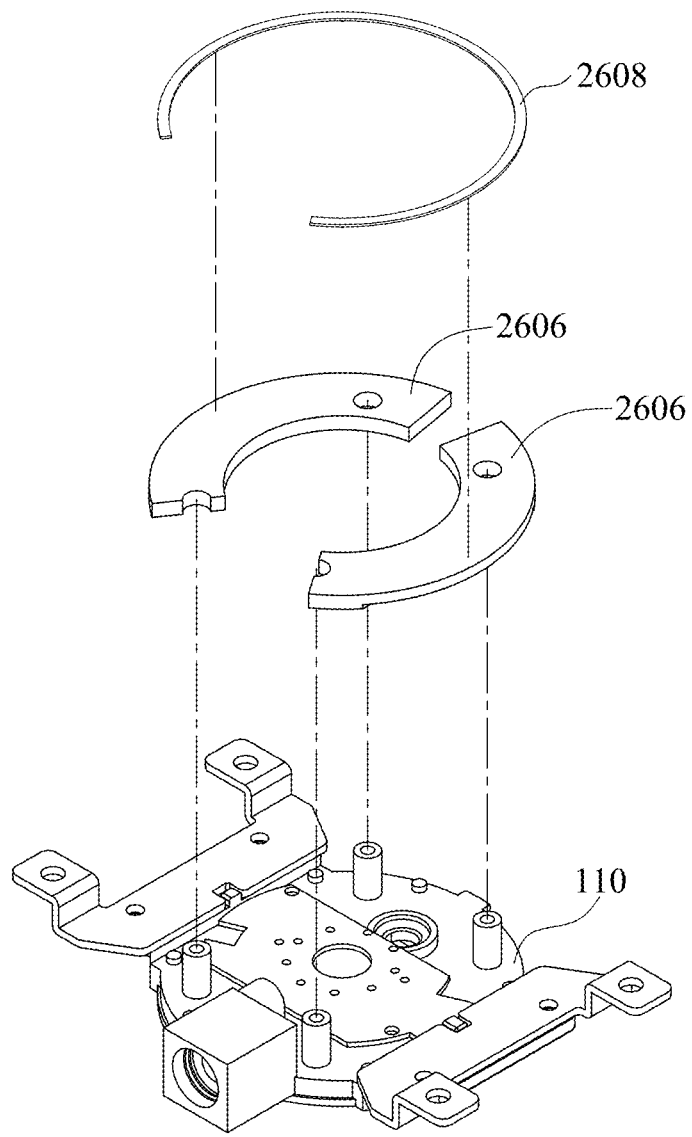
FIGS. 30 and 31 illustrate the second light assembly and the second light guide separated from the heat exchange unit.
Figure 31:
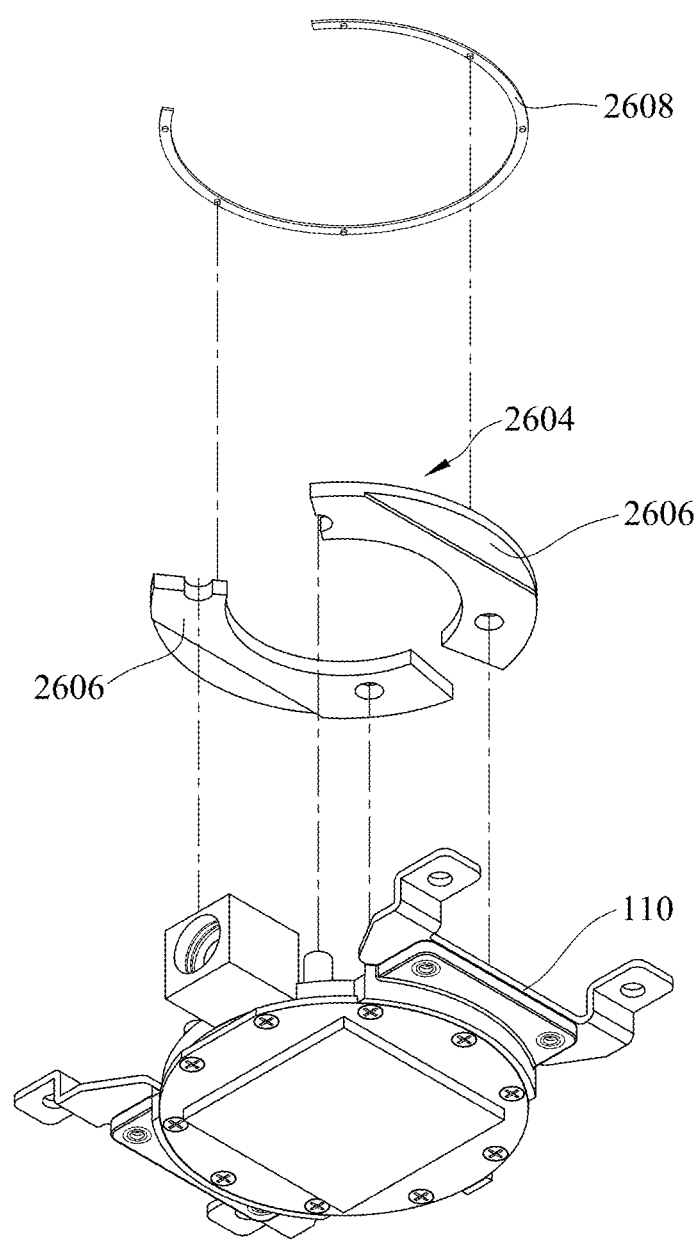

FIGS. 30 and 31 illustrate the second light assembly 2608 and the second light guide 2604 separated from the heat exchange unit 110.

Figure 32:
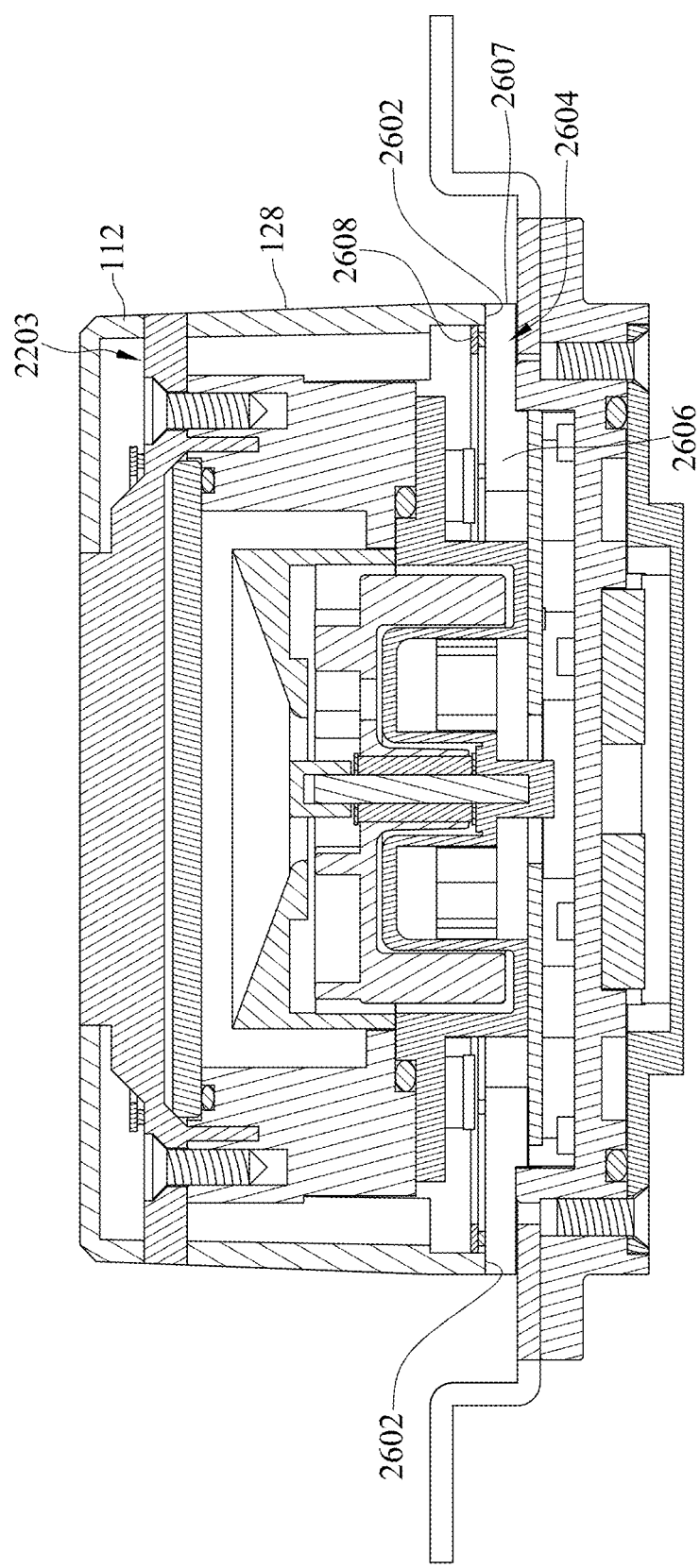
FIG. 32 illustrates a cross-sectional view of the heat dissipating device of FIG. 26 taken along the line 32-32.

FIG. 32 illustrates a cross-sectional view of the heat dissipating device 2600 of FIG. 26 taken along the line 32-32. The cross-sectional view illustrates the arrangement of the different components in the assembled state of the heat dissipating device 2600. As illustrated, the radially outer surfaces 2607 of the parts 2606 are received in the openings 2602 and are flush with the outer circumferential surface 128 of the cover 112. During operation, light from the light emitting devices is also emitted from the top and bottom of the outer cover 112 due to the light guides 2203 and 2604.

Therefore, embodiments disclosed herein are well adapted to attain the ends and advantages mentioned as well as those that are inherent therein. The particular embodiments disclosed above are illustrative only, as the embodiments disclosed may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present disclosure. The embodiments illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

What is claimed is:

1. A heat dissipating device, comprising:
    a bottom assembly;
    a first light guide positioned on the bottom assembly;
    a first light assembly including one or more light sources and positioned on the first light guide; and
    an outer cover positioned on the bottom assembly, the first light guide, and the first light assembly, the outer cover at least partially enclosing the bottom assembly, the first light guide, and the first light assembly, wherein:
       the outer cover defines a first opening on a top surface of the outer cover,
       an upper surface the first light guide is received in the first opening from within the outer cover, and
       light from the first light assembly is emitted from the heat dissipating device through the upper surface of the first light guide exposed through the first opening.

2. The heat dissipating device of claim 1, wherein the bottom assembly includes a pumping unit positioned on a cooling device and fluidly coupled thereto, wherein the pumping unit includes:
    an inlet unit fluidly coupled to an inlet of the heat dissipating device,
    a base including a stator portion and a rotor portion, wherein:
       the inlet unit is positioned on the base, and
       the inlet unit and the base cooperatively define a pump chamber, the pump chamber including the stator portion and the rotor portion, and the pump chamber being fluidly coupled to the inlet unit.

3. The heat dissipating device of claim 2, wherein the rotor portion includes a plurality of blades that are curved opposite to a direction of rotation of the rotor portion.

4. The heat dissipating device of claim 2, wherein the rotor portion includes a plurality of blades disposed on a top circular plate of the rotor portion, and
    wherein the plurality of blades and the top circular plate have contrasting colors with respect to each other.

5. The heat dissipating device of claim 2, wherein the rotor portion includes a plurality of blades disposed on a top circular plate of the rotor portion, and
    wherein the top circular plate has a contrasting color with respect to each of an inner circumferential surface of the inlet unit and a top surface of a rim of the inlet unit.

6. The heat dissipating device of claim 2, wherein the rotor portion includes a plurality of blades disposed on a top circular plate of the rotor portion, and
    wherein the plurality of blades have a contrasting color with respect to each of an inner circumferential surface of the inlet unit and a top surface of a rim of the inlet unit.

7. The heat dissipating device of claim 2, wherein the cooling device includes:
    a base plate configured to dissipate heat and including a heat exchanger;
    a sealing cover coupled to the base plate and at least partially enclosing the heat exchanger, the sealing cover and the base plate defining a heat exchange chamber that includes the heat exchanger, the sealing cover defining a second opening positioned above the cooling device; and
    a cover plate coupled to the base plate, the cover plate including:
       an outlet of the heat dissipating device,
       a third opening in fluid communication with the heat exchange chamber through the second opening, and
       a fourth opening defined adjacent the outlet, wherein the fourth opening is in fluid communication with the outlet, and is in fluid communication with the heat exchange chamber through the second opening.

8. The heat dissipating device of claim 2, further comprising a liquid guide disposed in the inlet unit and configured to guide liquid to the pumping chamber.

9. The heat dissipating device of claim 1, wherein:
    the first light guide includes a circular protrusion on the upper surface of the first light guide,
    the circular protrusion is received in the first opening from within the outer cover; and
    the first light assembly is annular and disposed about the circular protrusion.

10. The heat dissipating device of claim 1, wherein:
    the outer cover includes an elongated slot defined on an outer circumferential surface of the outer cover, and
    the first light guide includes a curved protrusion extending radially from an outer circumferential end of the first light guide, wherein:
       the curved protrusion is received in the elongated slot, and
       an end surface of the curved protrusion is flush with the outer circumferential surface of the outer cover.

11. The heat dissipating device of claim 10, further comprising a second light guide disposed in the bottom assembly,
    wherein the outer cover defines a second opening and a third opening on the outer circumferential surface of the outer cover, and the second light guide is received in the second opening and the third opening.

12. The heat dissipating device of claim 11, wherein the second light guide includes a first curved part and a second curved part each received in a corresponding one of the second opening and the third opening, and wherein radially outer surfaces of each of the first and second curved parts are flush with the outer circumferential surface of the outer cover.

13. The heat dissipating device of claim 11, further comprising a second light assembly disposed on the second light guide.

14. The heat dissipating device of claim 1, further comprising a glass cover positioned between the bottom assembly and the first light guide.

15. The heat dissipating device of claim 1, wherein the outer cover is at least in part translucent.

16. The heat dissipating device of claim 1, further comprising a processor controlling a first light source in the first light assembly to turn on and off at a first frequency determined at least based on a rotational speed of a plurality of blades of the heat dissipating device.

17. The heat dissipating device of claim 16, wherein the processor determines the first frequency in accordance one of equations $$f = \frac{R}{60} \times N \times C, f > \frac{R}{60} \times N \times C \text{ and } f < \frac{R}{60} \times N \times C,$$

wherein f is the first frequency, R is the rotational speed of the plurality of blades in revolutions per minute, N is number of the plurality of blades, and C is a natural number.

18. The heat dissipating device of claim 17, further comprising an input receiving a first input to enable the processor to change a value of C in accordance with an external input or a predetermined value.

19. The heat dissipating device of claim 18, wherein the processor updates the first frequency f based on a change in the value of C according to one of the equations.

20. The heat dissipating device of claim 18, wherein the rotational speed of the plurality of blades is varied based on a second input.

21. The heat dissipating device of claim 20, wherein the processor updates the first frequency based on a change in the rotational speed of the plurality of blades.

22. The heat dissipating device of claim 16, wherein the processor is configured, while maintaining the rotational speed of the plurality of blades, to control the first light source to turn on and off at a frequency which is higher or lower than the first frequency.

23. The heat dissipating device of claim 16, wherein the first light assembly comprises a second light source configured to emit light having a color different from that of the first light source, and
wherein the processor independently controls at least one of the first light source and the second light source.

24. The heat dissipating device of claim 23, wherein the processor controls at least one of the first light source and the second light source to turn on and off at the first frequency for a first time period and controls at least one of the first and second light sources to turn on and off at a second frequency for a second time period, wherein the first and second time periods are successive.

25. The heat dissipating device of claim 23, wherein, during a same period, the processor controls the first light source to turn on and off at the first frequency and controls the second light source to turn on and off at a second frequency different from the first frequency.

26. The heat dissipating device of claim 25, wherein the first frequency is equal to R/60×N×C, wherein R is the rotational speed of the plurality of blades in revolutions per minute, N is number of the plurality of blades, and C is a natural number.

27. The heat dissipating device of claim 25, wherein none of the first frequency and the second frequency is equal to R/60×N×C, wherein which R is the rotational speed in revolutions per minute, N is number of the plurality of blades, and C is a natural number.

28. The heat dissipating device of claim 23, wherein, during a same period, the processor controls the first and second light sources to turn on and off at the first frequency.

29. A heat dissipating device, comprising:
a bottom assembly;
a first light guide positioned on the bottom assembly, the first light guide including a circular protrusion on an upper surface of the first light guide and two curved protrusions extending radially outward from a circumferential edge of the first light guide;
a first light assembly positioned on the first light guide; and
an outer cover positioned on the bottom assembly and at least partially enclosing the bottom assembly, the first light guide, and the first light assembly, wherein:
the outer cover defines a first opening on a top surface of the outer cover, and defines a second opening and a third opening on an outer circumferential surface of the outer cover and adjacent the top surface,
at least a portion of the first light assembly is received in the first opening,
the two curved protrusions are received in a corresponding one of the second opening and the third opening, and
light from the first light assembly is emitted from the heat dissipating device through the portion of the first light assembly in the first opening and through the two curved protrusions.

30. The heat dissipating device of claim 29, wherein end surfaces of the two curved protrusion are flush with the outer circumferential surface of the outer cover.

31. The heat dissipating device of claim 29, wherein a top surface of the circular protrusion is flush with the top surface of the outer cover.

32. The heat dissipating device of claim 29, wherein the bottom assembly includes a pumping unit positioned on a cooling device and fluidly coupled thereto, wherein the pumping unit includes:
an inlet unit fluidly coupled to an inlet of the heat dissipating device; and
a base including a stator portion and a rotor portion, the rotor portion including a plurality of blades disposed on a top circular plate of the rotor portion, and
wherein the plurality of blades and the top circular plate have contrasting colors with respect to each other.

33. The heat dissipating device of claim 29, wherein the bottom assembly includes a pumping unit positioned on a cooling device and fluidly coupled thereto, wherein the pumping unit includes:
an inlet unit fluidly coupled to an inlet of the heat dissipating device; and
a base including a stator portion and a rotor portion, the rotor portion including a plurality of blades disposed on a top circular plate of the rotor portion, and wherein the top circular plate has a contrasting color with respect to each of an inner circumferential surface of the inlet unit and a top surface of a rim of the inlet unit.

34. The heat dissipating device of claim 29, wherein the bottom assembly includes a pumping unit positioned on a cooling device and fluidly coupled thereto, wherein the pumping unit includes:
an inlet unit fluidly coupled to an inlet of the heat dissipating device; and
a base including a stator portion and a rotor portion, the rotor portion including a plurality of blades disposed on a top circular plate of the rotor portion, and
wherein the plurality of blades have a contrasting color with respect to each of an inner circumferential surface of the inlet unit and a top surface of a rim of the inlet unit.

35. A heat dissipating device, comprising:
a bottom assembly;
a first light guide positioned on the bottom assembly and including a circular protrusion on an upper surface of the first light guide and two curved protrusions extending radially from an outer circumferential end of the first light guide;
a first light assembly positioned on the first light guide;
a second light guide including a first curved part and a second curved part each disposed in the bottom assembly;
a second light assembly disposed on the second light guide; and
an outer cover positioned on the bottom assembly and at least partially enclosing the bottom assembly, the first light guide, the first light assembly, the second light guide, and the second light assembly, wherein:
the outer cover defines a first opening on a top surface of the outer cover, a second opening and a third opening on an outer circumferential surface of the outer cover and adjacent the top surface, and a fourth opening and a fifth opening on the outer circumferential surface of the outer cover and adjacent a lower end of the outer cover,
at least a portion of the first light assembly is received in the first opening,
the two curved protrusions are received in a corresponding one of the second opening and the third opening,
the first and second curved parts are received in a corresponding one of the fourth opening and the fifth opening, and
light from the first light assembly is emitted from the heat dissipating device through the portion of the first light assembly in the first opening, through the two curved protrusions, and through the first and second curved parts.

36. The heat dissipating device of claim 35, wherein radially outer surfaces of each of the first and second curved parts are flush with the outer circumferential surface of the outer cover.

37. The heat dissipating device of claim 35, wherein end surfaces of the two curved protrusion are flush with the outer circumferential surface of the outer cover.

38. The heat dissipating device of claim 35, wherein a top surface of the circular protrusion is flush with the top surface of the outer cover.

39. The heat dissipating device of claim 35, wherein the bottom assembly includes a pumping unit positioned on a cooling device and fluidly coupled thereto, wherein the pumping unit includes:
an inlet unit fluidly coupled to an inlet of the heat dissipating device; and
a base including a stator portion and a rotor portion, the rotor portion including a plurality of blades disposed on a top circular plate of the rotor portion, and
wherein the plurality of blades and the top circular plate have contrasting colors with respect to each other.

40. The heat dissipating device of claim 35, wherein the bottom assembly includes a pumping unit positioned on a cooling device and fluidly coupled thereto, wherein the pumping unit includes:
an inlet unit fluidly coupled to an inlet of the heat dissipating device; and
a base including a stator portion and a rotor portion, the rotor portion including a plurality of blades disposed on a top circular plate of the rotor portion, and
wherein the top circular plate has a contrasting color with respect to each of an inner circumferential surface of the inlet unit and a top surface of a rim of the inlet unit.

41. The heat dissipating device of claim 35, wherein the bottom assembly includes a pumping unit positioned on a cooling device and fluidly coupled thereto, wherein the pumping unit includes:
an inlet unit fluidly coupled to an inlet of the heat dissipating device; and
a base including a stator portion and a rotor portion, the rotor portion including a plurality of blades disposed on a top circular plate of the rotor portion, and
wherein the plurality of blades have a contrasting color with respect to each of an inner circumferential surface and a top surface of a rim of the inlet unit.

42. A heat dissipating device, comprising:
a bottom assembly;
a first light guide positioned on the bottom assembly;
a first light assembly positioned on the first light guide; and
an outer cover positioned on the bottom assembly and at least partially enclosing the bottom assembly, the first light guide, and the first light assembly, wherein:
the outer cover defines a first opening on a top surface of the outer cover,
at least a portion of the first light guide is received in the first opening, and
light from the first light assembly is emitted from the heat dissipating device through the portion of the first light guide exposed by the first opening,
the bottom assembly includes:
an inlet unit fluidly coupled to an inlet of the heat dissipating device; and
a base including a stator portion and a rotor portion, the rotor portion including a plurality of blades disposed on a top circular plate of the rotor portion, and
wherein two of (1) the plurality of blades, (2) an inner circumferential surface of the inlet unit and a top surface of a rim of the inlet unit, and (3) the top circular plate have contrasting colors with respect to each other.

* * * * *